US011119165B2

United States Patent
Nevzorov et al.

(10) Patent No.: US 11,119,165 B2
(45) Date of Patent: Sep. 14, 2021

(54) PHOTONIC BAND-GAP RESONATOR FOR MAGNETIC RESONANCE APPLICATIONS

(71) Applicant: North Carolina State University, Raleigh, NC (US)

(72) Inventors: Alexander Nevzorov, Raleigh, NC (US); Alexej I. Smirnov, Raleigh, NC (US); Sergey Milikisiyants, Raleigh, NC (US)

(73) Assignee: North Carolina State University Office of Research Commercialization, Raleigh, NC (US)

( * ) Notice: Subject to any disclaimer, the term of this patent is extended or adjusted under 35 U.S.C. 154(b) by 76 days.

(21) Appl. No.: 16/626,714

(22) PCT Filed: Jun. 27, 2018

(86) PCT No.: PCT/US2018/039694
§ 371 (c)(1),
(2) Date: Dec. 26, 2019

(87) PCT Pub. No.: WO2019/005922
PCT Pub. Date: Jan. 3, 2019

(65) Prior Publication Data
US 2020/0158799 A1    May 21, 2020

Related U.S. Application Data

(60) Provisional application No. 62/525,888, filed on Jun. 28, 2017.

(51) Int. Cl.
*G01R 33/34*    (2006.01)
*G01R 33/341*   (2006.01)
*G01R 33/30*    (2006.01)

(52) U.S. Cl.
CPC ..... *G01R 33/34007* (2013.01); *G01R 33/341* (2013.01); *G01R 33/34069* (2013.01); *G01R 33/30* (2013.01)

(58) Field of Classification Search
CPC ............ G01R 33/341; G01R 33/34069; G01R 33/34007
See application file for complete search history.

(56) References Cited

U.S. PATENT DOCUMENTS 9,194,922 B2    11/2015    Blank et al.
9,722,318 B2 *   8/2017    Adriazola ................. H01P 3/10
(Continued)

FOREIGN PATENT DOCUMENTS

SU    1191798 A1    11/1985

OTHER PUBLICATIONS

International Search Report dated Oct. 18, 2018.

*Primary Examiner* — Dixomara Vargas
(74) *Attorney, Agent, or Firm* — Thomas Horstemeyer, LLP

(57) ABSTRACT

Aspects of photonic band gap resonators for magnetic resonance are described. In one example, an apparatus includes a 1D structure having a plurality of layers. A respective thickness of the individual layers is one-quarter of a respective wavelength of a target magnetic resonance frequency within the individual layers of the plurality of layers, or a multiple thereof. A first layer has a first dielectric constant, and a second layer that is adjacent to the first layer has a second dielectric constant. A defect includes a sample. The defect has a thickness that is approximately up to one-half of a wavelength of the target magnetic resonance frequency within the defect.

20 Claims, 13 Drawing Sheets

(56) References Cited

U.S. PATENT DOCUMENTS

| | | | | |
|---|---|---|---|---|
| 10,305,190 B2* | 5/2019 | Britz | ............ | H01Q 9/0485 |
| 10,340,603 B2* | 7/2019 | Henry | ............ | H01Q 9/0485 |
| 10,446,936 B2* | 10/2019 | Henry | ............ | H04B 3/56 |
| 10,637,149 B2* | 4/2020 | Britz | ............ | B29C 33/3835 |
| 10,938,108 B2* | 3/2021 | Henry | ............ | H01Q 15/24 |
| 2010/0127707 A1 | 5/2010 | Lee et al. | | |
| 2016/0033592 A1* | 2/2016 | Demir | ............ | G01R 33/286 |
| | | | | 324/322 |

* cited by examiner

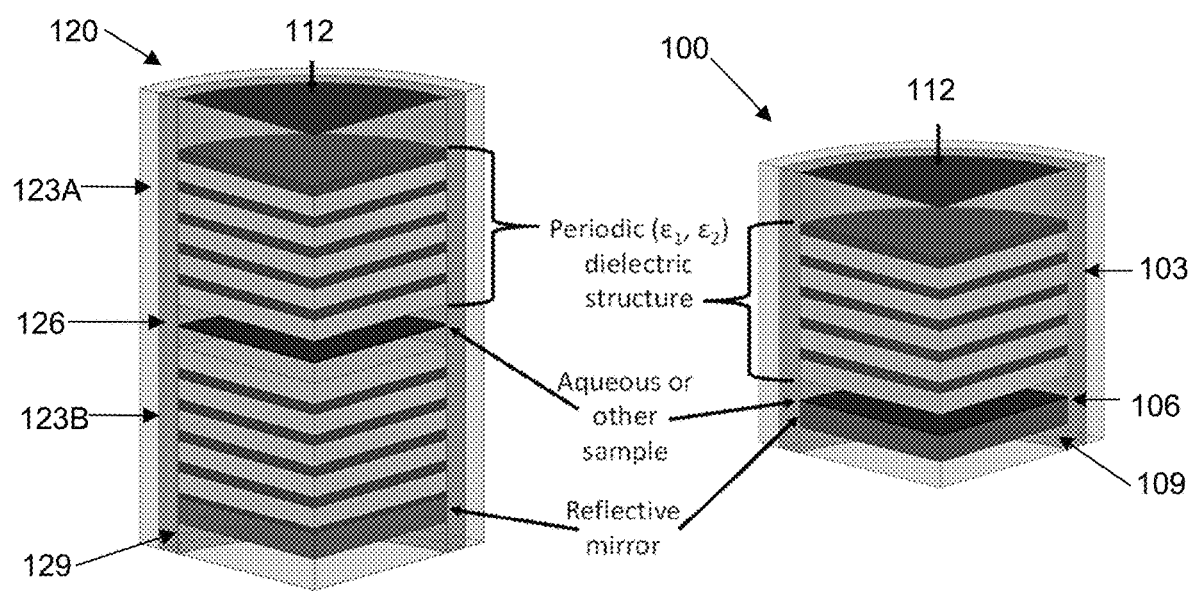
FIG. 1A  FIG. 1B

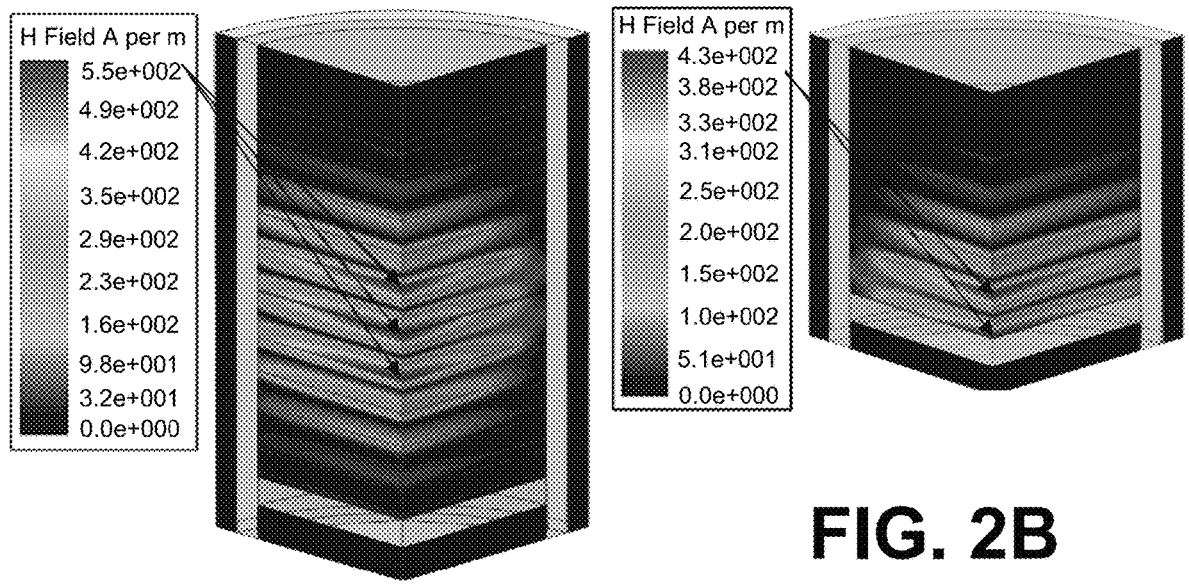
FIG. 2A
FIG. 2B
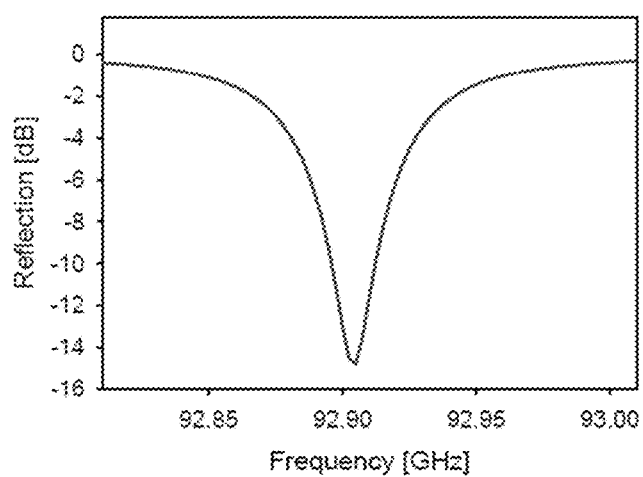
FIG. 2C

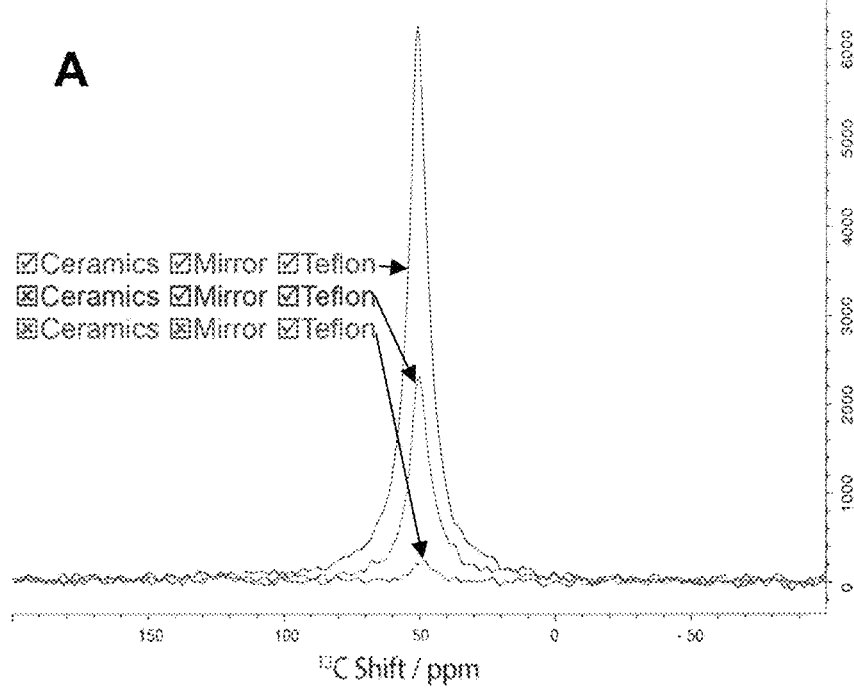
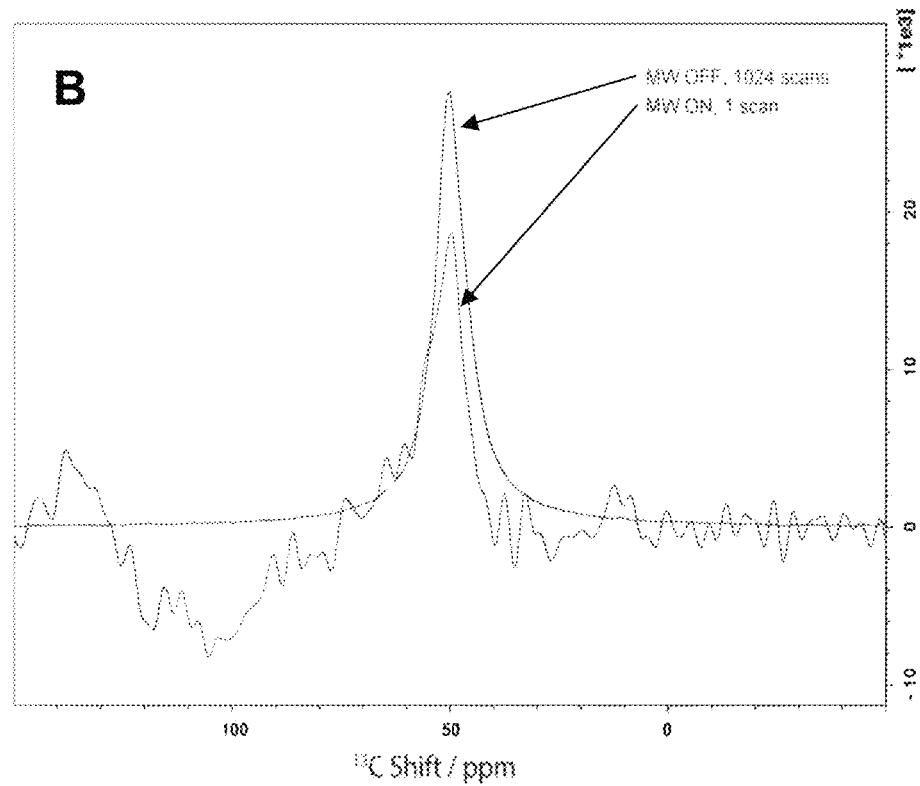
FIG. 7

PHOTONIC BAND-GAP RESONATOR FOR MAGNETIC RESONANCE APPLICATIONS

CROSS-REFERENCE TO RELATED APPLICATIONS

This application is the 35 U.S.C. § 371 national stage application of PCT Application No. PCT/US2018/039694, filed Jun. 27, 2018, and claims the benefit of U.S. Provisional Application No. 62/525,888, filed Jun. 28, 2017, each of which are hereby incorporated herein by reference in their entireties.

STATEMENT REGARDING FEDERALLY SPONSORED RESEARCH OR DEVELOPMENT

This invention was made with government support under grant number EB024110 awarded by the National Institutes of Health and grant number 1229547 awarded by the National Science Foundation. The government has certain rights to this invention.

BACKGROUND

Magnetic resonance spectroscopy including electron paramagnetic resonance (EPR) spectroscopy, nuclear magnetic resonance (NMR) spectroscopy, and double-resonance spectroscopy methods (electron nuclear double resonance (ENDOR), electron-electron double resonance (ELDOR), dynamic nuclear polarization (DNP), and the like) are powerful non-destructive analytical techniques to characterize the nature of specimens. However, there are many roadblocks towards employing these techniques, which involve subjecting the specimen to microwave, millimeter, and sub-millimeter wave electromagnetic field, to many types of the specimens, including but not limited to liquid hydrated samples and/or samples containing polar molecules.

BRIEF DESCRIPTION OF THE DRAWINGS

Many aspects of the present disclosure are better understood with reference to the following drawings. The components in the drawings are not necessarily drawn to scale, with emphasis instead being placed upon clearly illustrating the principles of the disclosure. In the drawings, like reference numerals designate corresponding parts throughout the several views.

FIGS. 1A-1B are illustrations of example Photonic Band-Gap (PGB) resonators according to the present disclosure.

FIGS. 2A-2B are illustrations of electromagnetic fields of example PBG resonators according to the present disclosure.

FIG. 2C is a graph that illustrates a reflection coefficient for an example PBG resonator according to the present disclosure.

FIGS. 7-11 are graphs that illustrate performance of example PBG resonators according to the present disclosure.

SUMMARY

Figure 3:
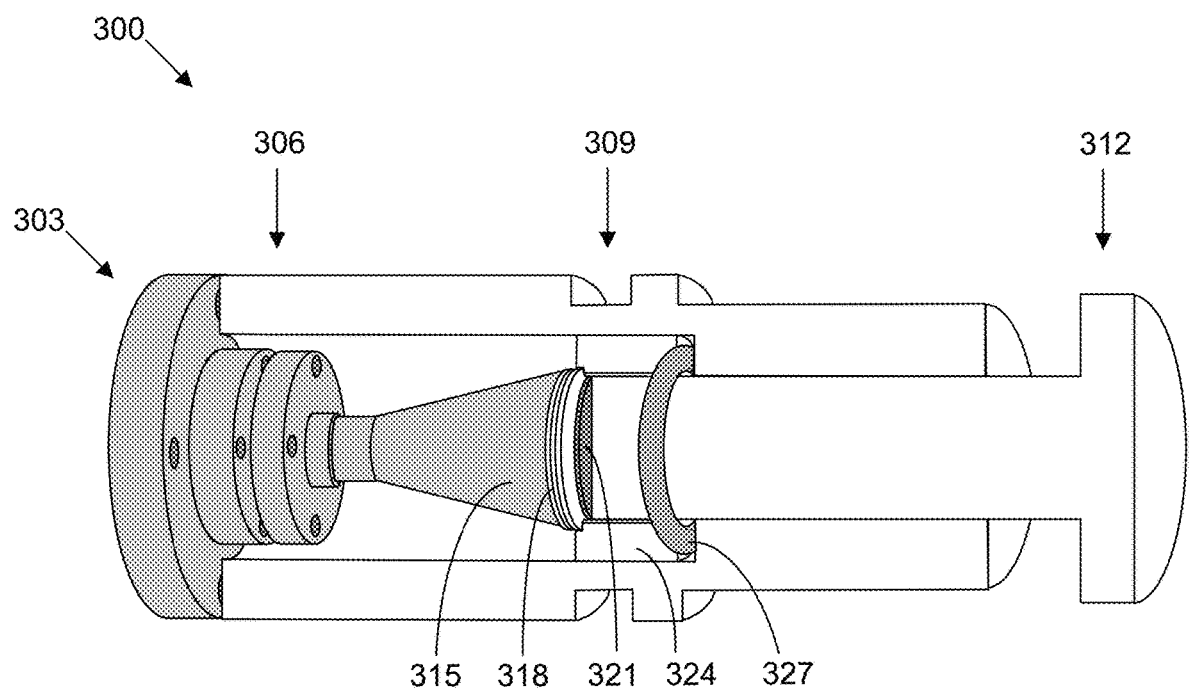
FIG. 3 is an illustration of an example PBG resonator according to the present disclosure.

In some aspects, a resonator or another apparatus can include a periodic 1D structure that includes a plurality of dielectric layers. Individual layers each have a respective thickness that is one-quarter of a respective wavelength of a target magnetic resonance frequency within that individual layer or a multiple thereof. A first layer can include a first dielectric constant. A second layer that is adjacent to the first layer can have a second dielectric constant. The first dielectric constant and the second dielectric constant can be different. A defect can include a sample for testing. Defect thickness can be up to one-half of a wavelength of the target magnetic resonance frequency within the defect or a multiple thereof. In some aspects, an electromagnetic coil can generate an electromagnetic field.

In some aspects, the resonator can also include a reflective surface. The defect can be adjacent to the reflective surface. The reflective surface can be curved, flat, or another shape. In some aspects, the resonator can include a movable plunger. The reflective surface can be attached to the movable plunger. The defect can be attached to the reflective surface. An adjustment of the movable plunger can tune the resonator.

In some aspects, the sample comprises a liquid confined between at least two layers of the defect. In other aspects, the defect comprises a porous material that is impregnated with the sample for testing. In further aspects, the periodic 1D structure can be formed within a cylinder having reflective surfaces. In some aspects, the target magnetic resonance frequency can be 2 GHz or greater. Also, the incident power at the target magnetic resonance frequency can be 100 mW or less. In other cases, power can be 100-200 W.

In some aspects the porous material can be a nanoporous membrane. One sample geometry for PBG resonators can be a flat thin film. This can match the field contours of the fundamental mode in the resonator, decrease the mmW scatter, and position the sample within the E=0 node of the mmW field. Some examples can utilize nanoporous anodic aluminum oxide (AAO) membranes. A shallow dielectric layer of nanoporous anodic aluminum oxide (AAO) on top of a metallic aluminum substrate can be employed.

DETAILED DESCRIPTION

The present disclosure generally relates to the field of magnetic resonance spectroscopy, including electron paramagnetic resonance (EPR) spectroscopy, nuclear magnetic resonance spectroscopy (NMR), and any combinations of EPR and NMR methods. As mentioned above, higher frequencies of electromagnetic field can cause problems with some design implementations of magnetic resonance probes.

Also, high field EPR can be used to study structure and dynamics of molecular systems possessing an unpaired electronic spin. However, high field EPR in biophysical research, especially for aqueous biological samples, can face substantial technical difficulties stemming from high dielectric millimeter wave (mmW) losses associated with non-resonant absorption by water and other polar molecules. The strong absorbance of mmW's by water also limits the penetration depth to just fractions of mm or even less, thus making fabrication of suitable sample containers rather challenging.

One standing problem with some magnetic design implementations of resonance probes is a non-resonant absorption of electromagnetic radiation by the specimen that can be caused by an interaction of the electrical component of the oscillating electromagnetic field with electrical dipoles of the molecules constituting the specimen. This effect, termed dielectric losses, can be the dominant absorption mechanism of electromagnetic field by liquid aqueous specimens when a dimension of the specimen along direction of propagating electromagnetic radiation exceeds the skin depth (i.e., the penetration depth of the electromagnetic radiation). The skin depth is determined by physical properties of the specimen at a particular temperature and the frequency of the electromagnetic radiation. As an example, the dielectric losses can be particularly high at some frequencies (e.g., around 30 to 1000 GHz) resulting in a skin depth (i.e., the penetration depth of the electromagnetic radiation) of less than 0.1-0.3 mm for liquid aqueous specimens. Therefore, the thickness of liquid aqueous specimens may be less than 0.5 mm at 30 GHz and progressively smaller at higher frequencies (e.g., less than 0.1 mm at 200 GHz) in order to be effectively irradiated using existing technologies. These skin depth requirements limit the specimen types that can be studied. In addition, handling of ultrathin samples (e.g., tubes with inner diameter of 0.3-0.1 mm) can be difficult and even impractical.

A second problem with designing a magnetic resonance probe for frequencies above 30 GHz is that the physical dimensions of volume resonators operating at fundamental resonance modes scale with the wavelength of the electromagnetic radiation. Specifically, a fundamental mode resonator for 30 GHz (Q-band) may have characteristic dimensions of a few multiples of 8 mm, 3 mm for 95 GHz (W-band), 1.5 mm for 200 GHz, and so on, with at least one of the specimen dimensions being about one tenth of the resonator size so the resonance mode of the resonator would remain largely unperturbed. These considerations make the fundamental mode resonators impractical or difficult to use for electromagnetic fields above around 100-140 GHz frequencies because the internal diameter of capillary tubes suitable for aqueous samples is becoming less than 0.2-0.1 mm, respectively.

A third problem arises when the same magnetic resonance probe is employed for experiments that require an irradiation of a specimen with electromagnetic radiation at two different frequencies. One example of such an experiment is Dynamic Nuclear Polarization (DNP), in which a specimen containing both electronic and nuclear spins is irradiated at two electromagnetic frequencies corresponding to EPR and NMR resonant conditions. The DNP method allows for an increase in the magnitude of the NMR signal up to about 660-fold for proton spins and even higher for other nuclei. In a DNP experiment, a specimen is experiencing the same polarizing static magnetic field, H, and, therefore, it can be irradiated at frequencies, $\omega_e = \gamma_e H$ and $\omega_n = \gamma_n H$, where $\gamma_e$ and $\gamma_n$ are the gyromagnetic ratio constants for the electronic and nuclear spins respectively. These equations constitute EPR and NMR resonant conditions, respectively. The ratio of $\gamma_e$ for the electronic spins S=½ to $\gamma_n$ of the nuclear spins I=½ of protons is ≈660; therefore, the frequency of the electromagnetic radiation for the electronic spins is about 660-fold greater than that of nuclear spin. Such a large difference in the frequencies imposes very different restrictions on both the optimal size of the probe and the sample geometry because of different skin depth and the dielectric losses.

Sufficiently high electronic $B_{1e}$ fields should be generated over the entire NMR sample volume for achieving measurable Dynamic Nuclear Polarization (DNP) effect for NMR signals. Millimeter wave (mmW) can be generated by powerful gyrotrons and/or extended interaction klystrons (EIKs) sources and then focused on the sample. However, further development of DNP methods including new DNP pulse sequences may require $B_{1e}$ fields higher than one could achieve with the current mmW technology. In order to address the challenge of boosting mmW field on the sample, a multi-resonant integrated DNP/NMR probehead can be utilized. One example probehead can operate at 198 GHz EPR/300 MHz $^1$H/75.5 MHz $^{13}$C NMR frequencies. The design of the multi-resonant probehead can be based on one-dimensional photonic band-gap (PBG) mmW resonator inside a double-tuned radiofrequency (rf) NMR saddle coil. Other rf NMR coil designs such as solenoid, bird-cage, surface coils, and stripline rf structure could be used among the others.

The photonic crystal can be formed by stacking discs with alternating high and low dielectric constants. The discs can be ceramic or another material. The thicknesses of the discs can be chosen to be $\lambda/4$, $3\lambda/4$, or $\lambda/4 + n\lambda/2$ where $\lambda$ is the wavelength of the incident mmW field and n is a natural number n=1, 2, 3, 4 . . . . When the mmW frequency is within the band gap of the photonic crystal, a defect created in the middle of the crystal can confine the mmW energy, thus, forming a resonant structure. A reflective mirror in the middle of the defect splits the structure in order to reduce its size and simplify the resonator tuning. The mirror can be made from aluminum foil or another metal. The resonator tuning can be achieved by adjusting the width of the defect by moving the mirror with respect to the dielectric stack. In some examples, this can be achieved using a gear mechanism. Examples of operating the multi-resonant DNP/NMR probehead with mmW generating equipment and existing NMR spectrometer include the use of a quasioptical 200 GHz bridge and a Bruker Biospin Avance II spectrometer equipped with a Bruker 7 T wide-bore 89 mm magnet parked at 300.13 MHz $^1$H NMR frequency.

A mmW bridge built with all solid state active components can allow for frequency tuning between ca. 190 to ca. 198 GHz with the output power up to 27 dBm (0.5 W) at 192 GHz and up to 23 dBm (0.2 W) at 197.5 GHz. Room temperature DNP experiments with a synthetic single crystal high-temperature high-pressure (HTHP) diamond (0.3×0.3× 3.0 mm$^3$) demonstrated significant—up to 90-fold—enhancement of $^{13}$C natural abundance NMR signal at incident mmW powers of as low as <100 µW. A $^{13}$C DNP enhancement of about 1,500 has been obtained at the maximum incident mmW power <0.2 W at 197.5 GHz. As determined from the DNP buildup curves and measurements at reduced average mmW powers performed in a gated mode of operation, the PBG resonator with loaded Q—200 provides ca. 5-8 fold gain in the average mmW power vs. the non-resonant mmW configuration employing only a reflective mirror.

In some DNP experiments, the magnetization transfer from the electronic spins to the significantly less polarized nuclear spins can involve a continuous irradiation of the sample with mm-waves (mmWs) at frequencies matching the DNP conditions. The exact parameters of the polarization transfer can be determined by the dominant mechanism of the DNP buildup, which for solid samples can occur through forbidden electron-nucleus spin transitions. This can require the application of sufficiently high electronic $B_{1e}$ fields over the entire volume of an NMR sample. High mmW fields can be generated by commercially available gyrotrons or extended interaction klystron (EIK) tubes. For the latter experimental configurations mmW electronic $B_{1e}$ field on the sample is enhanced by at least several folds by the current invention.

The DNP magnetization transfer can also be facilitated by cryogenic temperatures, at which the mmW dielectric losses at the sample can be small and the spin relaxation times can be sufficiently long, thus, allowing for the relatively slow DNP polarization transfer to be accumulated by the nuclear spin bath. This transfer can use 1-100 s of the contact time owing to the forbidden or a "weakly allowed" character of the spin transitions responsible for either the solid or cross DNP effects and the spin diffusion time. For the latter experimental configurations mmW electronic $B_{1e}$ field on the sample is enhanced by at least several folds by the current invention.

The DNP magnetization transfer can also be achieved under conditions of spinning the specimen (usually at a frequency of 1 to 130 kHz) at the magic angle of ca. $\theta \approx 54.74°$, where $\cos^2 \theta = 1/3$, with respect to the direction of the external magnetic field. Under such magic angle spinning (MAS) conditions the broad NMR lines from solid specimen become narrower and NMR resolution can be increased. MAS NMR experiments can be performed at both room and cryogenic temperatures. Cryogenic MAS NMR has been already demonstrated in a combination with DNP. The current invention can be applied to both room temperature and cryogenic DNP MAS conditions.

Increasing the incident mmW power can cause an excessive heating of liquid hydrated samples by mmW. High electronic $B_{1e}$ fields are also required for pulsed DNP schemes that currently cannot be demonstrated at high magnetic fields due to the insufficient power of the available mmW sources. Problems of dielectric losses and sample heating can be addressed in EPR by utilizing resonance probeheads and optimizing the sample geometry. For example, the issue of heating of aqueous samples by the microwaves can be resolved in EPR by forming a standing wave pattern in a resonance structure and placing the sample within the $E_{1e}$ node, thus, minimizing the dielectric loss and maximizing the $B_{1e}$ amplitude at the sample. Such a strategy can be implemented in EPR probeheads for X-band (9 GHz) and spectrometers operating at higher mmW frequencies. In order to effectively decrease the dielectric losses, at least one of the sample dimensions should not generally exceed quarter wavelength, $\lambda/4$, of the incident mmW irradiation. This consideration can be observed not only for aqueous but also for other samples because room temperature dielectric losses for many materials increase with mmW frequency. Resonators with high quality factors (Q-factors) can increase the $B_{1e}$ amplitudes at the sample.

Some examples of employing mmW resonators for DNP include a single mode ($TE_{011}$) cylindrical resonator coupled to an solenoid rf coil, a Fabry-Pérot (FP) resonator with an integrated stripline rf coil, as well as a report on using a commercial EPR resonator with the ENDOR coil tuned to the desired NMR frequency. Non-resonant mmW structures improved by reflectors and dielectric focusing can also be utilized for DNP applications, including in solid state NMR.

The sample volume accommodated by existing resonators remains small, thus, resulting in a suboptimal filling factor for the NMR coil. In some cases such a loss in the filling factor would prevail over potential sensitivity gains from DNP, thus, negating the benefits of DNP for the samples that could otherwise be studied by conventional NMR at larger volumes. For instance, the volume for an aqueous sample in an existing cylindrical $TE_{011}$ mode cavity resonator for DNP at 260 GHz was reported to be only 3 nL. However, the described NMR rf coil at the matching 400 MHz $^1$H frequency can accommodate 100's μl of sample, thus, achieving similar or even greater signal-to-noise ratios. While FP resonators are capable of accommodating larger sample volumes because such structures do not require all the sample dimensions to be comparable to the wavelength, they can be difficult to integrate with NMR rf coils and their mmW finesse can be strongly reduced by the resistive metal mirrors. In addition, sample dimensions for a FP resonator can still be required to be smaller than the diameters of the mirrors, thus imposing an additional restriction on the sample volume.

Thus, in order to utilize the available mmW power in the most efficient manner larger sample volumes can be integrated with efficient NMR rf coils while maintaining a reasonably high filling factor for NMR samples. For example, a multi-resonant DNP NMR probehead can be based on a photonic band gap (PBG) resonator housed inside a double-tuned if saddle coil. 1D PBG resonators can be suitable for larger sample volumes. Accordingly, the PBG resonator can expand the overall sample volume up to several microliters vs. just a fraction of microliters as reported for existing technologies. The Q-factor of PBG resonators can reach several hundred while exhibiting finesse exceeding the best values reported for loaded FP structures. Moreover, 1D PBG resonators can be integrated with minimal or no modification to the NMR rf coils. Optimal sample thickness in PBG resonators can be determined by the sample dielectric properties and the wavelength of the mmW field. In addition, the other two dimensions could be as large as the diameter of the dielectric layers forming the photonic crystal. The PBG resonators can also be made free of any metallic components, thereby avoiding unwanted microwave absorption by the resistive metal surfaces that increases with mmW frequency.

Another example can be provided by NMR spectrometers that are employing round and/or square tubes with 3 to 5 mm inner diameters (or edge lengths for square tubes) for liquid aqueous specimens studied at 200-1,500 MHz proton ($^1$H) NMR frequencies. The resonant EPR frequency corresponding to 200 MHz NMR frequency is about 130 GHz (D-band) and the optimal inner diameter (i.d.) for a tube for an aqueous specimen is about 0.15 mm or less. Thus, the use of 0.15 mm i.d. tube to satisfy EPR requirements vs. 3 mm i.d. tube for NMR would result in (3 0.mm/0.15 mm)$^2$=400-fold less specimen per unit length of the tube and the corresponding 400-fold loss in the NMR intensity. This 400-fold loss would negate almost all theoretically possible maximum gain of $\approx$660-fold for proton NMR signal due to the DNP effect. Similar examples can be constructed for DNP at NMR frequencies at or above approximately 200 MHz.

Thus, a need exists for improved resonator probe devices for the use in magnetic resonance spectroscopy and, specifically, in EPR, NMR, DNP NMR and related spectroscopy where the sample can be irradiated with electromagnetic radiation. The electromagnetic radiation can include at least one target frequency at or above approximately 2 GHz, and at or above approximately 94 GHz, at or above approximately 200 GHz, at or above approximately 300 GHz, at or above approximately 400 GHz, at or above approximately 500 GHz, and other frequencies. In some cases, frequencies can include frequencies in the range of 2 GHz to 3 THz.

The present disclosure can solve these problems using oversized resonant probe designs for an effective irradiation of a specimen with microwave, millimeter wave, and/or submillimeter wave electromagnetic radiation having frequency or frequencies resonant with the probes. Microwave electromagnetic radiation can refer to wavelengths of approximately 1 meter to 1 millimeter, millimeter wave electromagnetic radiation can refer to wavelengths of approximately 1 millimeter to 10 mm, and submillimeter wave electromagnetic radiation can refer to wavelengths of approximately 0.1 millimeter to 1 mm. The present disclosure includes a design of oversized (e.g., having greater linear dimensions than the wavelength of electromagnetic radiation in the plane perpendicular to the direction of mm-wave propagation) resonator/probehead that is based on forming lattice defects in one-dimensional (1D) photonic crystals or other periodic 1D structures. These defects in photonic crystals can behave as high quality factor (Q-factor) resonators for the use in EPR, NMR, or DNP NMR and related magnetic resonance methods or spectroscopy.

Examples described include high Q-factor mmW resonators that can be based on forming lattice defects in one-dimensional photonic band-gap (PBG) structures composed of low-loss ceramic discs having a thickness of $\lambda/4$ (or $\lambda/4+n\lambda/2$, where n is a natural number) and having alternating dielectric constants. A sample (either liquid or solid) can be placed within the E=0 node of the standing mm wave confined within the defect. The resonator development can be enhanced by the introduction of ceramic nanoporous membranes as flat sample holders of controllable thickness and tunable effective dielectric constant. A resonator prototype can be built and operated at 94.3 GHz. The Q-factor of an empty resonator can be $\approx 520$. The Q-factor can decrease slightly to $\approx 450$ when loaded with a water-containing nanoporous disc of 50 µm in thickness. The resonator can be utilized with a number of liquid biological samples and demonstrated about tenfold gain in concentration sensitivity vs. a high-Q cylindrical $TE_{012}$-type cavity. Detailed HFSS Ansys simulations can show that the resonator structure can be optimized by properly choosing the thickness of the aqueous sample and employing metallized surfaces. The PBG resonator design can be scaled to higher mmW frequencies and can accommodate significantly larger sample volumes than previously achieved with either Fabry-Perot or cylindrical resonators.

The present disclosure includes a resonator/probehead design for HF EPR that can be based on forming lattice defects in one-dimensional (1D) photonic crystals. Millimeter wave field simulations can demonstrate the applicability and utility of 1D photonic crystals as efficient resonators for mmW EPR. A periodic arrangement of planar layers having alternating dielectric permittivities can be constructed and utilized. The structure can be designed to have a defect where an EPR sample can be placed, which can create a narrow frequency pass band outside which the mm-waves can be effectively reflected. The defect can also create a resonant structure that confines the mm-waves. Losses from highly absorptive liquid aqueous samples can be minimized by placing the sample effectively within the electric E=0 node. A similar result can be obtained by placing a ferromagnetic metal layer at the node of the electric field in a photonic crystal. The 1D photonic crystals can exhibit the largest E=0 nodes vs. 2D and 3D photonic structures, thus allowing for larger sample dimensions. The latter can be advantageous for EPR and for Dynamic Nuclear Polarization (DNP) NMR. The 1D photonic crystals can be readily fabricated. In one example, a probehead can be constructed for 94 GHz (W-band) CW EPR using a series of liquid aqueous samples at room temperature.

Examples described can employ a periodic arrangement of dielectric layers of materials with different dielectric properties in alternating layers, creating a frequency band, in which propagating electromagnetic waves can be rapidly attenuated. Materials can include ceramics, polymers, composites, etc. and the layered periodic structure can be formed by using different materials or even forming air- or gas- or liquid-filled gaps in between solid layers. In such a structure, a specimen (either liquid or solid) can occupy one of the layers creating a defect in the periodic structure. The defect can create a cavity confining electromagnetic wave and constitutes a resonant structure called a photonic band-gap (PBG) resonator. The dielectric loss can be minimized by placing the specimen within the electric E=0 node of the electromagnetic wave. Compared to 2D and 3D photonic crystals, defects in 1D structures can exhibit the largest E=0 nodes allowing for maximizing sample dimensions in the XY plane (i.e., the plane that is perpendicular to the direction of the propagating electromagnetic field that is denoted by Z-direction in this example). 1D crystals can be relatively easy to fabricate and the resonant structure can be easily tuned (i.e., the resonant frequency can be adjusted) as can be demonstrated through the present disclosure.

A number of layers and the thicknesses of the layers (e.g., in multiples of $\lambda/4$) can be determined or optimized, for example, by minimizing the thickness and the number of the layers to reduce dielectric losses while maintaining the target resonance frequency. A thickness of a layer that includes a defect can be different from a multiple of $\lambda/4$, where $\lambda$ is the wavelength of the electromagnetic radiation in the material of which the layer is made. However, the defect layer can also be optimized to be approximately a multiple of $\lambda/4$, and, in some cases; for example, the defect layer can also be optimized to be approximately $\lambda/2$.

1D periodic resonant structures can be fabricated from dielectric materials having isotropic dielectric constant or the dielectric constant that depends upon direction (i.e., anisotropic dielectric material). The anisotropic dielectric properties can be utilized to maximize the desired resonance frequency through the 1D periodic structure. For example, in some cases, materials having anisotropic dielectric properties can be used to achieve the target resonance frequency within the layers of the 1D periodic structure. Dielectric properties of materials used in the 1D periodic resonant structure can alternate such that the alternating layers have different dielectric properties. Alternating the dielectric properties can be used to achieve the desired resonance frequency. Accordingly, while each layer in the 1D periodic structure can have a thickness that corresponds to $n\lambda/4$, where n is a natural number, the actual thicknesses of each layer can be different.

In one example, a photonic bandgap resonant structure can be split by a reflective mirror right in the middle of the defect. One example of a reflective mirror is provided by a metallized surface. Second example is provided by a slotted metallized surface. Third example is provided by a surface metallized in a pattern (such as checker, dotted, or other patterns). Forth example is provided by a mirror constructed from non-conductive materials. This configuration can be referred to as a "split defect" photonic bandgap (PBG) resonator. A sample (either liquid or solid) can be located right on the top of a reflective and/or conductive mirror, which can correspond to the E=0 node of the electromagnetic field. A sample can include simple chemicals and compounds to polymers, proteins, and biological cells, or any material. The resonator can operate to obtain molecular structures or otherwise characterize the nature of specimens or samples, for example, through spectroscopy. For the split defect PBG resonator, the position of the metal mirror can be adjusted for tuning of the resonant frequency. The split defect PBG resonator can be fabricated by stacking flat round circles of a dielectric material of defined thickness. The resonant frequency of the resonator can be tuned by moving the sample along the direction of the electromagnetic field. In some cases, the sample can be moved together with the bottom flat mirror. The PBG resonator can be constructed, for example, from dielectric layers including $n\lambda/4$ quartz plates separated by air, another gap, or another dielectric of $n\lambda/4$ thickness, where n is a natural number and $\lambda$ is a wavelength of a target frequency through a material having certain dielectric properties (e.g., $\lambda=c_0/(f\cdot\sqrt{\varepsilon})$ where $c_0$ is speed of light in free space, f is frequency and $\varepsilon$ is dielectric constant or relative permittivity for a particular material). Accordingly, because each layer can have $n\lambda/4$ thickness, the thickness can vary with the materials, as $\lambda$ can differ for the various materials having different relative permittivity or dielectric constant. Quartz and air can be replaced by other dielectric materials.

In a second example, a defect where the specimen can be placed can be formed in a center between the dielectric plates of a periodic 1D structure. In further examples, a defect where the specimen can be placed can be formed between the dielectric plates of a periodic 1D structure at any layer, above or below the center of the periodic 1D structure. The structural elements of the resonator and the $n\lambda/4$ thickness of the layers remain the same as in the first example. The periodic resonant structure can be terminated by a reflective mirror at the end or operated without such a mirror, including a transmission mode that involves detection of the transmitted electromagnetic millimeter wave radiation. The structure with the defect in the center can be called a "full defect" PBG resonator.

In a third example, multiple periodic defects can be formed in either "split" or "full" PBG resonators. Such a multiple defect configuration allows for placing multiple layers of the specimen inside the probe and increasing useful sample volume and signal intensity of magnetic resonance spectroscopy.

In a fourth example, the periodic 1D dielectric structure can formed inside a cylinder with reflective and/or conductive surfaces designed to effectively reflect electromagnetic millimeter wave radiation employed for the excitation of the resonance mode in either "split" or "full" PBG resonator. An electromagnetic radiofrequency field can be produced within the periodic 1D dielectric structure using an electromagnetic coil that can also serve for NMR detection.

In a fifth example, a mirror or other reflective surface of a split PBG resonator can be either flat or curved to improve reflection of electromagnetic millimeter waves from the surface. A reflective surface can be formed by a dielectric layer of different permittivity, or an electrically conductive or superconductive layer (e.g., metallized surface). The reflective surface can be smooth or patterned to improve reflection of the electromagnetic radiation and suppress undesirable resonance modes.

In a sixth example, the sample can be (a) a flat layer fabricated from a solid material, (b) a liquid confined between two or more dielectric layers such as flat dielectric surfaces ("full" PBG resonator) or a dielectric surface and a reflective mirror ("split" PBG resonator), or (c) either liquid or solid material incorporated into a porous host material such as a disc of nanoporous or mesoporous material of the desired thickness to satisfy the $n\lambda/4$ specification. Examples of (c) include ceramic nanoporous membranes formed from anodic alumina (also known as "anodic aluminum oxides", or AAO) and other porous and fibrous ceramic/polymer/composite materials that can be impregnated with a specimen such as a liquid specimen containing molecules with unpaired electronic spins (either mono-, bi, or poly-radicals). The use of a porous host material allows for (1) maintaining highly uniform thickness of the specimen layer and (2) attenuating the effective dielectric constant of the specimen by changing, for example, pore diameter and the distance between the pores for a given dielectric constant of the specimen.

In another example, a resonator can include a periodic 1D structure that includes a plurality of dielectric layers. Individual layers of the dielectric layers can each have a respective thickness that is one-quarter of a respective wavelength of a target resonance frequency within that individual layer, or a multiple thereof. The target resonance frequency can be a millimeter wave frequency. A first layer of the dielectric layers can have a first dielectric constant. A second layer that is adjacent to the first layer can have a second dielectric constant. The first dielectric constant and the second dielectric constant can be different. The resonator can also include a defect that includes a sample for testing. In some examples, a defect thickness can be up to one-half of a wavelength of the target resonance frequency within the defect. An electromagnetic coil can generate an electromagnetic field for NMR excitation and the same or other coil could be used for NMR detection.

In some cases, the resonator can also include a reflective surface. In some cases, the defect can be adjacent to the reflective surface. In further examples, the resonator can include a movable plunger and the reflective surface can be attached to the movable plunger, the defect can be attached to the reflective surface, and an adjustment of the movable plunger tunes the resonance frequency of the resonator. The sample can include a liquid confined between at least two layers of the defect. In some cases, the defect includes a porous material that is impregnated with the sample for testing. In some situations, the periodic 1D structure can be formed within a cylinder having surfaces reflective to millimeter waves.

A target magnetic resonance frequency can include at least one target frequency approximately 2 GHz or greater, and approximately 94 GHz or greater, approximately 198 GHz or greater, approximately 200 GHz or greater, approximately 300 GHz or greater, approximately 400 GHz or greater, approximately 500 GHz or greater, and other frequencies. In some cases, target frequencies can include frequencies in the range of 2 GHz to 3 THz.

High field EPR can characterize specimen by studying structure and dynamics of molecular systems, for example, those possessing an unpaired electronic spin, from analysis of EPR spectra. However, high-field EPR in biophysical research, especially for aqueous biological samples, can face substantial technical difficulties stemming from high dielectric millimeter wave (mmW) losses associated with nonresonant absorption by water and other polar molecules. The strong absorbance of mmW's by water can limit the penetration depth to just fractions of 1 mm or even less, thus making fabrication of suitable sample containers rather challenging. The present disclosure includes high Q-factor mmW resonators that can be based on forming lattice defects in one-dimensional photonic band-gap (PBG) structures composed of low-loss ceramic discs of $\lambda/4$ in thickness or multiples of thereof and having alternating dielectric constants. A sample (either liquid or solid) can be placed within the E=0 node of the standing mm wave confined within the defect. The resonator development can be enhanced by the introduction of ceramic nanoporous membranes as flat sample holders of controllable thickness and tunable effective dielectric constant. One example resonator can be built and utilized at 94.3 GHz. The Q-factor of this resonator can be $\approx 520$. The Q-factor can decrease slightly to $\approx 450$ when loaded with a water-containing nanoporous disc of 50 μm in thickness. The resonator can be tested with a number of liquid biological samples and can result in about tenfold gain in concentration sensitivity vs. a high-Q cylindrical $TE_{012}$-type cavity. Based on detailed HFSS Ansys simulations, the resonator structure can be further optimized by properly choosing the thickness of the aqueous sample and employing metallized surfaces. The PBG resonator design can be scalable to higher mmW frequencies and can accommodate significantly larger sample volumes than previously achieved with either Fabry-Perot or cylindrical resonators.

The continuing growth of high field EPR for the studies of structure and dynamics of molecular systems possessing an unpaired electron spin is supported by the expanding availability of state-of-the-art continuous wave (CW) and pulsed spectrometers, for example, those operating at 94, 130, 263, and 275 GHz. These frequencies fall into the millimeter wave (mmW) or extremely high frequency (EHF) range as per the International Telecommunication Union designation for the band of radio frequencies in the electromagnetic spectrum from 30 to 300 GHz. Capabilities for EPR at resonant frequencies of up to 1.5 THz can be demonstrated. Problems can stem from an unfavorable combination of much smaller wavelengths of mmW field vs. $\lambda=3$ cm corresponding to the conventional X-band (9 GHz) and the high dielectric losses in water over the entire mmW frequency range. Moreover, the strong absorbance of mm-waves by the water molecules (at 13-36 dB/mm) limits the penetration depth to just fractions of mm or even less, thus making fabrication of suitable sample containers rather challenging. These are just some of the main technical reasons why the concentration sensitivity of HF EPR still lags behind the conventional X-band EPR even though the Boltzmann magnetization increases with the field.

Fundamental mode (FM) n-moded volume resonators (typically n=1, 2), such as cylindrical $TE_{01n}$-type cavities, can offer high Q-factors ($Q\approx 4,000$ for an unloaded $TE_{012}$ resonator at W-band (94 GHz). However, they require ultra-small sample tubes for aqueous samples (i.d.=100-200 μm) and such miniature tubes can be rather delicate to handle. FM resonators operating at higher resonant frequencies can require smaller tubes even for non-lossy samples in order to maintain optimal geometry of the resonant mode. For example, a sample tube having i.d. of just 150 μm can be employed for placing non-lossy samples into a FM cylindrical 275 GHz resonator cavity having $Q\approx 1,000$. Since the dimensions of the FM EPR resonators scale down with the mmW length, the optimal volume of aqueous samples in cylindrical cavities reaches only several tens of nl at W-band and reduces to 2-12 nl at 260 GHz. Although the high $B_{1e}$ field conversion factors of such resonators are useful for pulsed EPR even at modest incident powers provided by solid state sources, CW EPR experiments can suffer from saturation and rapid passage effects as well as large microphonic noise induced by the magnetic field modulation.

Fabry-Perot (FP) resonators can result in: (i) larger sample size/volume and (ii) compatibility with quasioptical components employed to minimize transmission losses in a mmW bridge while enabling the induction-mode detection by an effective separation of the excitation and reflection mmW beams. The coupling of FP resonators is most efficiently achieved by a conductive mesh that can act as a partially reflective mirror. For FP resonators a figure of merit can be finesse, $\mathcal{F}$, which can expand the concept of Q-factor applicable to the FM resonators to multimode structures. Similar to Q-factor, finesse $\mathcal{F}$ characterizes the resonator losses vs. stored energy. However, to make this parameter independent of the resonator length, the losses are counted per roundtrip between the resonator mirrors; whereas Q-factor accounts for losses per oscillation cycle. Consequently, depending on the distance between the mirrors, the high Q-factor of a FP resonator does not necessarily translate into high $B_{1e}$ fields generated at the sample which is placed within one of the $E_1=0$ nodes because the $B_{1e}$ field is also stored at other multiple $E_1$ nodes along the quasioptical mmW path. Another major drawback of FP resonators for their use in EPR is stemming from the largely inevitable high resistive losses in the mesh that become especially problematic at mmWs because the resistivity of metals increases rapidly with the mmW frequency. Indeed, the reported finesse $\mathcal{F}$ values drop from 500 to 30 upon increasing the resonant frequency from 90 to 600 GHz with $\mathcal{F}=500$ being the maximum achievable value for an empty resonator at W-band (94 GHz). Unfortunately, the finesse of loaded FP resonators can decrease even further because of additional mmW losses and/or unwanted mmW beam scattering by the sample itself. Because the FP resonators are based on optical principles, a high finesse is only achievable if the separation between the mirrors is several-fold greater than the wavelength, $\lambda$. For such a geometry even a small angle scattering caused by the sample can yield significant distortions of the planar wave front after being reflected multiple times, thereby degrading the finesse. This problem worsens for aqueous samples due to the very high loss tangent of water at mmW frequencies. For FP resonators loaded with aqueous samples, the values off $\mathcal{F}=60$ can be obtained at W-band and $\mathcal{F}=50-100$ at 260 GHz. Finally, the filling factor, $\eta$, of FP resonators can be low because the sample occupies only a tiny fraction of the large resonator volume as dictated by its quasioptical design.

The present disclosure describes a resonator/probehead design for HF EPR that is based on forming lattice defects in one-dimensional (1D) photonic crystals. In order to demonstrate the applicability and utility of 1D photonic crystals as efficient resonators for mmW EPR, mmW field simulations can be employed. Further, a periodic arrangement of planar layers having alternating dielectric constants (also called dielectric permittivities) can be constructed and tested. The structure can be designed to have a defect where an EPR sample was placed, thus creating a narrow frequency pass band outside which the mm-waves can be effectively reflected. The defect can also create a resonant structure confining the mm-waves. Defects in the photonic crystals can enhance both the Kerr and Faraday effects in a thin ferromagnetic material layer. Losses from highly absorptive liquid aqueous samples can be minimized by placing the sample effectively within the electric E=0 node. A ferromagnetic metal layer can also be placed at the node of the electric field in a photonic crystal. 1D photonic crystals can exhibit the largest E=0 nodes vs. 2D and 3D photonic structures, thus, allowing for larger sample dimensions. The description of the 1D photonic crystal and concepts described herein can be used for both EPR and for Dynamic Nuclear Polarization (DNP) NMR. Features discussed regarding EPR can be used for DNP resonators, and features discussed regarding DNP can be used for EPR as well.

A general approach to aqueous sample holders based on nanoporous anodic aluminum oxide (AAO) membranes is also described. Sample geometry for PBG resonators can include a flat thin film or a stack of thin films. Such a shape can match the field contours of the fundamental mode in a resonator, decrease the mmW scatter, and position the sample within the E=0 node. AAO membranes, which can be applied as a mechanical alignment media for lipid bilayers and membrane proteins in EPR and NMR, can be utilized as sample holder. A shallow dielectric layer of nanoporous anodic aluminum oxide (AAO) on top of a metallic aluminum substrate can be employed as a sample holder integrated with a mm-wave reflective mirror.

With reference to FIG. 1A, shown is a cross-section of a PBG resonator 120. The structure of the PBG resonator 120 can be referred to as a "full" PBG resonator. 1D periodic dielectric structures 123A and 123B can be fabricated from dielectric materials with desired dielectric constants, ε. A sample 126 such as an aqueous sample can be formed as a liquid layer between the quartz plates or an aqueous sample could be soaked into nanopores of AAO disc fabricated to the desired pore density, diameter, and thickness. A reflective surface 129 can be located under the 1D periodic dielectric structures 123B such that the 1D periodic dielectric structures 123B are between the reflective surface 129 and the sample 126.

The PBG resonator 120 can also utilize electromagnetic radiation, $TE_{11}$, $HE_{11}$, or another excitation within the PBG resonator 120. In some cases, the periodic 1D dielectric structures 123A and 123B can be formed inside a material reflective to millimeter waves and/or conductive, such as a cylinder made of a reflective and/or conductive material or utilizing a reflective and/or conductive surface to effectively reflect electromagnetic mm-wave radiation employed for the excitation of the resonance mode. While a cylindrical shape is shown, other shapes such as rectangular prisms, and other polygons can be used.

With reference to FIG. 1B, shown is a cross-section of a PBG resonator 100. The structure of the PBG resonator 100 can be referred to as a "split" photonic band-gap (PBG) resonator. 1D periodic dielectric structures 103 can be fabricated from dielectric materials with desired dielectric constants, ε. A sample 106 such as an aqueous sample can be formed between quartz plates, or filled into nanopores of anodic aluminum oxide (AAO) wafer fabricated to the desired pore density, diameter, and thickness. In some cases, the sample can have a relatively large volume (e.g., microliter volumes) distributed over a relatively large area (e.g., around 10-20 mm diameter). In some cases the diameter could be 0.2-20 cm. In some cases, volumes can include up to 6 μL, including up to approximately 1 μL, up to approximately 2 μL, up to approximately 3 μL, up to approximately 4 μL, up to approximately 5 μL, up to approximately 6 μL, and other volumes. A reflective surface 109 can be located under the sample 106. For example, the sample 106 can be placed on the reflective surface, or can otherwise be between the reflective surface 109 and the 1D periodic dielectric structures 103.

A distance between the sample 106 and the 1D periodic dielectric structures 103 can be adjusted to achieve tuning the resonant frequency of the PBG resonator 100 to the desired value. Additionally or alternatively, a distance between the reflective surface 109 and the 1D periodic dielectric structures 103 can be adjusted to tune the frequency of the PBG resonator 100. In some cases, the sample 106 and the reflective surface 109 can be moved at the same time, and can be attached or otherwise in contact. The PBG resonator 100 can also include $TE_{11}$, $HE_{11}$ modes of the electromagnetic field 112 and other types of modes of the electromagnetic radiation to excite a resonance mode. In some cases, the periodic 1D dielectric structures 103 can be formed inside a reflective and/or conductive material such as a cylinder made of a reflective and/or conductive material. The reflective and/or conductive surface can effectively reflect electromagnetic radiation employed for the excitation of the resonance mode. While a cylindrical shape is shown, other shapes such as ellipsoidal prisms, rectangular prisms, and other polygons or polygonal prisms can be used.

While each of the 1D periodic dielectric structures 103 can be a disc shape as shown, any shape such as ellipsoidal, rectangular, square, trapezoidal, hexagonal, or other shapes can be used for each of the 1D periodic dielectric structures 103. A shape and dimensions of individual ones of the 1D periodic dielectric structures 103 can be different from shapes for other ones of the 1D periodic dielectric structures 103. A shape and dimensions of a reflective mirror can be different from shapes of the 1D periodic dielectric structures 103. A shape and dimensions of a reflective outside shield can be different from shapes of the 1D periodic dielectric structures and/or the reflective mirror 103. Further, while in some cases all of the dielectric structures of the 1D periodic dielectric structures 103 can be the same dielectric material, in other cases, a material for individual ones of the 1D periodic dielectric structures 103 can be different from materials for other ones of the 1D periodic dielectric structures 103. Likewise, the defect layer can be any shape, including ellipsoidal, rectangular, square, trapezoidal, hexagonal, or other shapes.

There are a number of possible configurations of a 1D PBG EPR resonator. Two possible configurations are shown in FIGS. 1A and 1B. Both configurations shown can be based on forming 1D photonic crystals from a stack of dielectric discs having alternating dielectric constants, $\varepsilon_1 \neq \varepsilon_2$. For example, the discs can have the same diameters $d \gg \lambda$ and thicknesses of $\lambda/4$ where $\lambda$ is the wavelength in the corresponding dielectric material. The stack can be arranged so that the disc with the larger $\varepsilon_2$ faces the incoming mmW front such as, for example, a $TE_{11}$ mode provided by an oversized circular waveguide.

The thickness of each of the dielectric layers can be $$\frac{\lambda}{4} + n\frac{\lambda}{2},$$

where n is a non-negative integer number, i.e., n=0, 1, 2, 3, . . . . The number n can be different for each of the layers, i.e. the adjacent layers can have the thicknesses of:

$$\frac{\lambda_1}{4} + n_1\frac{\lambda_1}{2},$$

where $n_1$ is a non-negative integer number, i.e. $n_1$=0, 1, 2, 3, . . . and $$\frac{\lambda_2}{4} + n_2 \frac{\lambda_2}{2},$$

where $n_2$ is a non-negative integer number, i.e. $n_2$=0, 1, 2, 3, . . . , $\lambda_1$ and $\lambda_2$ are the lengths of mmW field in the respective layers with the dielectric constants of $\varepsilon_1$ and $\varepsilon 2$, respectively, and $n_1$ and $n_2$ can each be any non-negative integer number and can be the same or different. Alternatively, combined thickness of the two adjacent dielectric layers with two different dielectric constants of $\varepsilon_1$ and $\varepsilon_2$ can be equal to:

$$n\frac{\lambda}{2}$$

where n is a natural number, i.e., n=1, 2, 3, . . . and $\lambda$ is the combined wavelength of the mmW field across the two dielectric layers.

The thickness of each of the dielectric layers can also be described as $$\frac{\lambda}{4},$$

where O is an odd natural number, i.e. O=1, 3, 5, 7, . . . . The number O can be different for each of the layers, i.e. the adjacent layers can have the thicknesses of:

$$O_1 \frac{\lambda_1}{4},$$

where $O_1$ is an odd natural number i.e. $O_1$=1, 3, 5, 7, . . . and $$O_2 \frac{\lambda_2}{4},$$

where $O_2$ is an odd natural number, i.e. $O_2$=1, 3, 5, 7, . . . , $\lambda_1$ and $\lambda_2$ are the lengths of mmW field in the respective layers with the dielectric constants of $\varepsilon_1$ and $\varepsilon_2$, respectively, and $O_1$ and $O_2$ can each be any odd natural number and can be the same or different.

The dielectric layers can be physically separate layers that are pressed together or a solid composite structure in which layers are adhered together by a glue or other means. Alternatively, a solid layered dielectric structure can be formed by other means. The layered structure fabrication can be fabricated by layer-by-layer deposition, pressing and baking individual dielectric layers, sputtering individual layers, 3D printing, etc. The thickness of the sample layer can be related to $\lambda/2$. For example, thickness can be less than $\lambda/2$ in order to optimize some resonator characteristics. However, thickness of the sample layer can be up to $\lambda/2$, or up to any multiple of $\lambda/2$.

Materials for the dielectric layers can be solids, liquids, and gases and a combination of thereof, Examples of solids include crystals, ceramics, glasses, powders, polymers, and porous materials, Examples of liquids include oils, organic solvents, and inorganic liquids. Examples of gases include air, nitrogen, or gases at very low pressure such as vacuum. A combination of materials can be a porous ceramic filled with another solid material, polymer, liquid, or gas. A combination of materials can be a metamaterial defined as a synthetic composite material with a structure such that it exhibits properties not usually found in natural materials. An example of a metamaterial property not found in natural materials can be a negative refractive index.

The one-dimensional PBG resonator configurations can differ by the location of the defect where the sample is placed. In a first configuration a defect can be formed by breaking the periodicity of the alternating dielectric layers in the middle of the dielectric stack by replacing a dielectric layer with a sample. This configuration can be considered as a "full defect" PBG resonator (e.g., FIG. 1A). A sample (either liquid or solid) in the form of a flat disc can be placed in the middle of the defect, exactly or substantially at the location of the E=0 node of the standing wave confined in the crystal defect. In a second "split defect" configuration, a reflective mirror can be placed in the middle of the defect (e.g., FIG. 1B), thus, replacing the second half of the dielectric stack with its virtual reflected image. Thus, the "split defect" structure can be essentially equivalent to the "full defect" resonator but operating in the reflection mode. While the "full defect" configuration can be useful because it does not suffer from the absorptive mmW losses occurring in the reflective mirror, the "split defect" configuration can be useful as being simpler to fabricate, having a lesser number of parts. This configuration can also have the ability to frequency-tune the split defect PBG resonator by adjusting the position of the reflective mirror with respect to the dielectric stack with the sample attached directly to the mirror.

As indicated above, FIGS. 1A and 1B show representations of two possible configurations for 1D PBG EPR resonators. 1D photonic crystal can be formed by a stack of discs of alternating dielectric constants $\varepsilon_1 < \varepsilon_2$ (light and dark, respectively) with $\varepsilon_1$ (lighter) layer adjacent to the sample. The discs can have the same diameters d>>$\lambda$ and their thickness can be (2n+1)$\lambda/4$, where n=0, 1, 2 . . . , and $\lambda$ in the mmW length in the corresponding dielectric medium. One side of the stack can be open for mmW excitation (red) using either $TE_{11}$ or $HE_{11}$ mode while the opposite side can be terminated with a reflective (metallic) mirror (dark gray) to achieve a reflection mode operation. A flat EPR sample such as, for example, a lossy aqueous solution (blue), can form a defect in the 1D photonic crystal. When the defect is placed in the middle of the crystal a "full defect" configuration can be achieved (FIG. 1A). Alternatively, the sample can be placed directly on the reflective mirror ("split defect" configuration (FIG. 1B)).

A "split defect" PBG resonator can be by a 1D photonic crystal composed of five (5) $\lambda/4$ quartz ($\varepsilon$=4) discs separated by air gaps which are also $\lambda/4$-thick. The diameter of the quartz discs can be chosen to be D=14 mm or ≈172 $\lambda$ and the discs can be enclosed by a cylinder with conductive walls (FIG. 1, light gray). In some cases, resistivity losses at the cylinder walls can be small due to its highly oversized diameter (i.e., D>>$\lambda$). The resistive losses in the conductive mirror can be minor vs. those incurring in the metallic coupling meshes of FP resonators. The sample holder can be modeled as a flat disc (diameter: 14 mm, height: 40 µm) composed of nanoporous anodic aluminum oxide (AAO) with pores filled with water. The bulk dielectric properties of such a composite sample can be in-between those of pure water and $\gamma$-$Al_2O_3$ that the pores are mainly composed of. The dielectric properties of pure water at mmW frequencies and, for 25° C. can yield $\epsilon'$=7.8 and tan($\delta$)=1.87 at 93 GHz. Ceramic $Al_2O_3$ can be $\epsilon'$=9.21 at 13.38 GHz, tan($\delta$)=0.000084. The volume of AAO pores can be varied by adjusting anodization and pore enlargement procedures from ca. 10% to 80%. Such fabrication flexibility can allow for varying the effective bulk dielectric properties of AAO sample holder filled with an aqueous sample. An intermediate value of $\epsilon'$=9.0 and tan($\delta$)=0.7 can be chosen. Incident microwave power of 4 W can be considered.

FIG. 2A shows an illustration of electromagnetic fields within an example PBG resonator like the PBG resonator 120 of FIG. 1A. A shield around the 1D PBG structure is assumed to be a perfect conductor. In this example, the "full" resonator contains a 60 μm—thick layer of nanoporous AAO filled with 50% of water. FIG. 2B shows an illustration of electromagnetic fields within an example PBG resonator like the PBG resonator 100 of FIG. 1B, for example, a "split" resonator. Simulations of electromagnetic B1 field for can be obtained by ANSYS HFSS (Canonsburg, Pa.) software package. A shield around the 1D PBG structure is assumed to be a perfect conductor. In this example, the "split" resonator contains a 40 μm—thick layer of nanoporous AAO filled with 50% of water. FIG. 2C shows an illustration of a reflection coefficient for the "split"—defect PBG (FIGS. 1B, 2B) corresponds to quality Q≈2,500 at the resonant frequency of about 92.9 GHz.

The illustration shows example results of HFSS simulations of the mmW $|B_1|$ field distribution at the resonant frequency of 92.9 GHz (W-band). The example results show that the $|B_1|$ field can be primarily concentrated at the sample and then can decays in the dielectric discs away from the mirror. The calculated reflection coefficient (FIG. 2B) can yield high Q-factor (Q~2,500) even when the resonator is loaded with a lossy aqueous sample. The resonator can be loaded with a flat 40 μm—thick nanoporous AAO holder containing an aqueous sample (not clearly visible at this scale). Incident microwave power of 4 W can be utilized for this example.

There can be a relationship between finesse and Q-factor for a 1-D photonic crystal resonator composed of N λ/4 dielectric layers. In some aspects, multimode resonators can be characterized by finesse $\mathcal{F}$ rather than the quality factor Q. The latter parameter is developed for LC circuits and FM (fundamental mode) microwave cavities, in which the sample can be readily placed in the only available electric-field $E_1$=0 node of the standing wave. In some resonators, such as FP structures, the separation between the mirrors can be significantly greater than λ, thus, resulting in significantly more energy stored along the quasioptical path vs. smaller FM cavities. Since the losses of optical FP resonators can occur at the mirrors, the high total energy stored in FP structures can result in high effective Q-factors even though the electromagnetic energy stored within individual $E_1$=0 nodes and the corresponding magnitude of the magnetic field component $|B_1|$ can be small. For such multi-mode structures an effective measure of the resonator performance can be finesse, $\mathcal{F}$.

Several definitions of $\mathcal{F}$ for FP resonators, i.e., when the absorption processes between the mirrors are negligible, can be found. Finesse $\mathcal{F}$ can be a ratio of the linewidth of the transmission or reflection signal (the full width at half maximum, FWHM) and the free spectral range, FSR:

$$\mathcal{F} = \frac{FSR}{FWHM} = \frac{\pi}{2\arcsin\left(\frac{1-r_1r_2}{2\sqrt{r_1r_2}}\right)}, \quad (1)$$

where $r_1$ and $r_2$ are the amplitude reflectivities of the mirrors.

When the finesse is high, i.e. $r_1$ and $r_2$ are close to 1, the Taylor series approximation yields:

$$\mathcal{F} \approx \frac{\pi}{1-r_1r_2} = \pi\frac{U}{\delta U_{diss}} = \frac{Q}{n'} \quad (2)$$

where U is the total energy stored in the resonator, $\delta U_{diss}$ is the energy dissipated per roundtrip, Q is the resonator Q-factor, and n is the number of half-wavelengths between the mirrors. This simple relationship between finesse $\mathcal{F}$ and Q-factor is typically employed in the EPR literature when describing the performance of FP resonators.

Eq. (2) is valid for a uniform non-lossy dielectric medium confined between the mirrors. For a PBG resonator the energy stored is non-uniform along the resonator length and this can be taken into account. An analogous equation for the finesse of 1D PBG resonator composed of N pairs of dielectric plates with alternating $\varepsilon_1$ and $\varepsilon_2$ dielectric constants having λ/4 thickness can be obtained.

For the example of an FP resonator in which the total electromagnetic energy stored, $$U = \int_0^{V_{Res}} 1/2(\varepsilon_o E^2 + \mu_0 H^2)dV, \quad (3)$$

where $\varepsilon_o$ and $\mu_0$ are the permittivity and permeability of the free space, (vacuum or air) respectively, and the integral is taken over the resonator volume. If one neglects the beam variation along the resonator length, L, (i.e., in the direction of the beam propagation), this equation can be approximated as:

$$U = \int_0^{V_{Res}} \frac{1}{2}(\varepsilon_o E^2 + \mu_0 H^2)dV \approx sLE_0^2 \approx ns\frac{\lambda}{2}E_0^2, \quad (4)$$

because it can be shown that the magnetic and electric energies stored from 0 to λ/4 along the standing wave path in a uniform medium can be identical or substantially identical. In eq. (4) n is the number of half-wavelengths between the mirrors, $E_0$ is the amplitude of the electric field in the $B_1$=0 node, and s is the proportionality coefficient determined by mmW front surface area.

As already noted above, for 1D standing wave in a medium composed of alternating dielectric layers of λ/4 in thickness, the electric energy can be equal to the magnetic energy, leading to the following relation between the electric field and the magnetic field amplitudes at the corresponding maxima (and the nodes for the other field):

$$\varepsilon E_0^2 = \mu H_0^2, \quad (5)$$

For a split-defect PBG structure shown in FIG. 2, the total electromagnetic energy stored in the resonator can be a sum of the energies stored in the sample and in each of the dielectric layers, and can be readily calculated from the continuity conditions for the electric and magnetic fields at the respective dielectric boundaries.

Another example can be an empty split-defect PBG resonator. Then for an air gap between the metallic mirror and the nearest dielectric layer ($\varepsilon_1$) having ~λ/4 thickness and an effective surface area s the energy stored can be:

$$U_0 \approx s\frac{\lambda}{4}E_0^2 \quad (6)$$

At the boundary between the air gap and the first dielectric layer, the electric field is continuous while the magnetic field has a node. Thus, the energy stored in the first dielectric layer can be estimated as:

$$U_1 \approx \sqrt{\varepsilon_1}\, s \frac{\lambda}{4} E_0^2 \tag{7}$$

Here, both increased electric field amplitude and a decreased thickness of the dielectric layer can be taken into account. At the next boundary between the first dielectric layer ($\varepsilon_1$) and second dielectric layer ($\varepsilon_2$) the magnetic field is continuous and the electric field has a node. Thus, energy stored in this layer can be, therefore:

$$U_2 \approx \frac{\varepsilon_1}{\sqrt{\varepsilon_2}}\, s \frac{\lambda}{4} E_0^2 \tag{8}$$

Similarly, the total electromagnetic energies stored in the third and fourth layers can be:

$$U_3 \approx \frac{\varepsilon_1^{\frac{3}{2}}}{\varepsilon_2}\, s \frac{\lambda}{4} E_0^2 = \frac{\varepsilon_1}{\varepsilon_2} U_2 \tag{9}$$

$$U_4 \approx \frac{\varepsilon_1^2}{\varepsilon_2^{\frac{3}{2}}}\, s \frac{\lambda}{4} E_0^2 = \frac{\varepsilon_1}{\varepsilon_2} U_3 \tag{10}$$

By summing these equations for a PBG resonator consisting of a $\lambda/4$ air gap and N pairs of $\lambda/4$ dielectric plates with alternating $\varepsilon_1$ and $\varepsilon_2$ dielectric constants, the following expression for the total energy U stored can be:

$$U \approx s\frac{\lambda}{4}\left\{1 + \varepsilon_1\left(\frac{1}{\sqrt{\varepsilon_1}} + \frac{1}{\sqrt{\varepsilon_2}}\right)\left(1 + \frac{\varepsilon_1}{\varepsilon_2} + \dots \frac{\varepsilon_1^{N-1}}{\varepsilon_2^{N-1}}\right)\right\} E_0^2 \tag{11}$$

By comparing eqs. (11) and (4) an effective $n_{\text{eff}}$ for the split-defect PBG resonator can be obtained:

$$n_{\text{eff}} \approx \frac{1}{2}\left\{1 + \varepsilon_1\left(\frac{1}{\sqrt{\varepsilon_1}} + \frac{1}{\sqrt{\varepsilon_2}}\right)\left(1 + \frac{\varepsilon_1}{\varepsilon_2} + \dots \frac{\varepsilon_1^{N-1}}{\varepsilon_2^{N-1}}\right)\right\} \tag{12}$$

so the finesse $\mathcal{F}$ of 1D PBG split defect resonator can be related to the Q-factor in a form analogous to eq. (2) for the Fabry-Perot structure:

$$\mathcal{F} = \frac{Q}{n_{\text{eff}}} = 2Q\left\{1 + \varepsilon_1\left(\frac{1}{\sqrt{\varepsilon_1}} + \frac{1}{\sqrt{\varepsilon_2}}\right)\left(1 + \frac{\varepsilon_1}{\varepsilon_2} + \dots \frac{\varepsilon_1^{N-1}}{\varepsilon_2^{N-1}}\right)\right\}^{-1} \tag{13}$$

For the full defect structure, the total energy can be double that for the split-defect structure, and the expression for the finesse becomes the same as eq. (13) except an additional factor of 2, viz.:

$$\mathcal{F} = \frac{Q}{2 n_{\text{eff}}} = Q\left\{1 + \varepsilon_1\left(\frac{1}{\sqrt{\varepsilon_1}} + \frac{1}{\sqrt{\varepsilon_2}}\right)\left(1 + \frac{\varepsilon_1}{\varepsilon_2} + \dots \frac{\varepsilon_1^{N-1}}{\varepsilon_2^{N-1}}\right)\right\}^{-1} \tag{14}$$

Most of the energy can be stored within the defect layer if $$\frac{\varepsilon_1}{\varepsilon_2} < 1, \text{ i.e.,}$$

the layer with the lower $\varepsilon_1$ must be adjacent to the defect.

While finesse of a FP resonator characterizes the stored energy per number of half-wavelengths between the mirrors (cf eq. (2)), the parameter $\mathcal{F}$ for PBG resonator introduced in eqs. (13) and (14) characterizes the stored energy at the defect site where an EPR sample is located.

The examples of the split-defect PBG resonator can yield Q≈2,500. According to eq. (13) this value translates into an effective finesse of $\mathcal{F}$ ≈1,700. Contrary to the FP resonator with equally distributed magnetic field energy between the $E_1$ nodes, this can demonstrate that for the split defect PBG resonator a large portion of all of the mmW energy can be localized at the defect site. A "split defect" resonator for W-band EPR can be designed.

FIG. 3 is an illustration of an example PBG resonator 300 according to the present disclosure. The PBG resonator 300 includes a bulkhead 303, a frame 306, a groove 309 for hosting an EPR modulation coil, a plunger 312, a gain horn 315, dielectric layers 318, a sample 321, a holder 324, and an o-ring 327 that can provide compression. The bulkhead 303 can have a circular cross-section as shown or a rectangular cross-section, or another cross-sectional shape. In some cases, the bulkhead 303 can be a WR10 bulkhead (i.e., a bulkhead operating at 75-100 GHz). The bulkhead 303 can be in connection with the gain horn 315.

The gain horn 315 can be between the bulkhead 303 and the dielectric layers 318 within the frame 306. The gain horn 315 can include a conical area and can have circular cross-sections as shown or a rectangular cross-sections or another cross-sectional shape. The gain horn 315 can have a gain of about 5 dB, 10 dB, 15 dB, 20 dB, 25 dB, 30 dB, or another gain. The gain horn 315 can be a standard gain horn. The gain horn 315 can have the bulkhead 303 at one end of the gain horn 315 and the dielectric layers 318 at another end of the gain horn 315. While the gain horn 315 is shown with a smaller end towards the bulkhead 303 and a larger end towards the dielectric layers 318, a component that funnels or tapers down from a larger end near the bulkhead 303 to a smaller end near the dielectric layers 318 can also be used.

The frame 306 can be made of polyetherimide (PEI), ultem, rexolite, polyetheretherketone (PEEK), polyaryletherketone (PAEK), other thermoplastics, other resins, or other materials. The frame 306 can also include the groove 309 within the frame 306. The groove 309 can be used for an electromagnetic coil, such as magnetic field modulation coil to generate an electromagnetic field of a lower frequency such as 1-1,000 kHz in order to provide for phase-sensitive detection of magnetic resonance signal in continuous wave magnetic resonance experiment or to increase bandwidth of microwave/millimeter wave/submillimeter wave excitation in DNP experiment. Not all uses of the probehead structure involve 1-1,000 kHz modulation coil. The frame 306 can be used to contain and/or hold various components of the PBG resonator 300. For example, the bulkhead 303 can be connected at the first end of the frame 306, and the gain horn 315 can be connected to the bulkhead 303 and held or suspended within the frame 306 using the bulkhead 303 and/or the frame 306.

The dielectric layers 318 can include a 1D PBG structure that includes a number of layers with alternating dielectric properties as discussed. The dielectric layers 318 can be in the split resonator configuration, full resonator configuration, or another configuration. Accordingly, the sample 321 can be at one end of the dielectric layers 318 with a reflective layer adjacent to the sample 321 (e.g., split) or at a center of the dielectric layers 318 or between any of the dielectric layers 318 (e.g., full). In some cases, multiple samples 321 can be used including split and full PBG configurations. For example, some of the samples 321 can be adjacent or be placed directly at the end of the plunger 312, and others can be between dielectric layers. The sample 321 can be considered a defect in the dielectric layers 318.

As shown, the sample 321 is at the reflective end of the plunger 312, which can provide the reflective surface for electromagnetic radiation. The reflective end of the plunger 312 can be aluminum foil or another metallic foil, mirror, or another reflective surface or layer as discussed. In some examples, the sample 321 can be fixed with respect to or connected to the dielectric layers, and the plunger can be moved, thereby moving the reflective surface with respect to the dielectric layers 318 and the sample 321. In other examples, the sample 321 can be fixed with respect to, or connected to the plunger 312, and the sample 321 can move along with the reflective surface, with respect to the dielectric layers 318. This can tune the resonator 300. In some cases, the plunger 312 can be ceramic, ultem, polyetherimide (PEI), ultem, polyetheretherketone (PEEK), polyaryletherketone (PAEK), other thermoplastics, other resins, or other materials. The plunger 312 can move through an O-ring 327 such as an O-ring made from Buna-N, Viton, silicone or other materials, which can steady the plunger 312, hold it centered and in place. While one o-ring 327 is shown, multiple o-rings can be used.

Design of a "split defect" PBG resonator for W-band (94 Ghz) EPR. A schematic cross-section of an example "split effect" photonic band-gap resonator is shown in FIG. 3. A standard gain horn can be utilized provided for a conversion from the fundamental $TE_{10}$ mode of the rectangular WR10 waveguide to an approximately oversized circular $TE_{11}$ mode. A WR10 bulkhead adapter can be attached to the horn and also to the cylindrical outer frame made of Ultem™ 1000 by using brass screws. A 1D photonic crystal can be formed from a stack of $\lambda/4$ dielectric discs that can be placed inside a Rexolite holder (other materials for the holder can be used including metals such as aluminum) and pressed against the horn with a silicone O-ring to mechanically stabilize and align the structure held by four (4) tightening screws. A reflective mirror can be attached to a threaded Ultem plunger and a sample can be positioned directly on the mirror, thus forming a "spit defect" PBG structure. The mirror can be cut from a 50 μm thick adhesive aluminum foil and glued to the tuning plunger. Other materials could be used to form a mirror reflective to mm waves. The frequency of the PGB resonator can be tuned by rotating the plunger, which can result in a parallel displacement of the mirror with respect to the dielectric stack. A coil for 100 kHz magnetic field modulation can enable phase sensitive detection of continuous wave (CW) EPR signal can be formed inside a groove in the Ultem body.

As indicated above, FIG. 3 shows a schematic cross-section of an example "split effect" photonic band-gap (PBG) 1D resonator 300 for W-band EPR. 1D PBG resonance structure can formed by discs with alternating dielectric constants $\varepsilon_1$ and $\varepsilon_2$ 318 that are pressed against the standard gain conical horn 315. The "split effect" PBG structure can be formed by an aluminum mirror attached to the flat end of a threaded plunger 312 with the sample 321 mounted directly on the mirror. The frequency tuning can be achieved by turning the plunger by a knob causing the mirror to move with respect to the PBG dielectric stack.

In some example resonators and results described, a ID Photonic Band Gap Resonator for 94 GHz EPR is utilized. For example, ceramic quarter-lambda wafers composed of Yttria-stabilized zirconia polycrystal (YTZP, thickness: 140±12.7 μm), alamina (AL, thickness: 252±12.7 μm) and aluminum nitride (ALN, thickness: 0.0107±0004") can be cut into discs of 16 mm in diameter using a laser cutter/engraver. S1-UV Fused Silica discs (diameter: 16.000±127 mm, thickness: 0.400±127 mm) can be used. Air gaps of $\sim\lambda/4$ thickness between the solid dielectric layers can be formed by using thin Rexolite® 1422 (a cross-linked polystyrene) rings with o.d.=16 mm, i.d.=15 mm, and thickness of 0.75 mm. Aluminum foil of 0.05 mm in thickness can be employed to form a metallic mirror. The resonator body frame can be fabricated from Ultem 1000 (standard unfilled polyetherimide) and attached by brass screws to WR10 bulkhead adapter. The sample/resonator holding ring can be machined from Rexolite® while other miscellaneous parts for initial bench tests can be machined from aluminum or other metals and other materials. The conical aperture of a standard 22 dB gain horn can be reduced to i.d.=14 mm and the modified horn was used to feed mmW from a rectangular WR10 waveguide into the PBG resonator. Simulations of the electromagnetic field distribution can be carried out using Ansys HDSS software package from Ansys, Inc.

W-band (94.3 GHz) EPR spectrometer. W-band (94.3 GHz) EPR spectra can be acquired using a continuous wave (CW) spectrometer. The spectrometer can employ a cryogen-free superconducting magnet (e.g., maximum field of 12.1 T) with an integrated 0.12 T superconducting sweep coil to provide accurate scans of the magnetic field in the vicinity of the target value. The homodyne microwave bridge can include a single-channel design. A varactor-controlled low-noise (e.g., phase noise ca. 75 dB/Hz at 100 kHz) Gunn oscillator can be frequency locked to the EPR resonator using an AFC circuit operating at 70 kHz. The oscillator can have an output power of 60 mW which can yield about 30 mW at the resonator after ca. 3 dB combined losses from the narrow band circulator, isolator, and an oversized WR-28 section of the waveguide, which can be employed to transmit the 94 GHz field along the magnet bore with minimal losses. CW W-band EPR spectra can be measured at room temperature using 100 kHz magnetic field modulation provided by the SRS830 lock-in amplifier.

Aqueous sample for cylindrical TE102-mode W-band cavity resonator. Aqueous samples were drawn by capillary action into clear fused quartz capillaries (i.d.=0.20 mm, o.d.=0.33 mm), with the ends sealed with Critoseal®. The sample can be centered in the resonator using a nylon holder so that the sealed ends can remain outside the cavity. For such a resonator the active length of the aqueous sample can be about 2 mm and, therefore, the active volume can be ≈63 nl.

Chemicals and solvents. Nitroxide spin probes Tempol (4-hydroxy-2,2,6,6-tetramethyl-piperidine 1-oxyl) and 5DSA (5-doxyl-stearic acid, 2-(3-carboxypropyl)-4,4-dimethyl-2-tridecyl-3-oxazolidinyloxy) and $Gd^{3+}$-DOTA complex (diethylenetriamine-pentaacetic acid gadolinium(III) dihydrogen salt hydrate) can be used. Perdeuterated Tempone (or PDT, perdeuterated 4-oxo-2,2,6,6-tetramethyl-1-piperidi-nyloxy) can also be used. 3-Carboxy-Proxyl (1-Oxyl-2,2,5,5-tetramethyl-2,5-dihydro-1H-pyrrole-3-carboxylic acid) can also be used. Gramicidin from *Bacillus brevis* was purchased from Fischer Scientific Co. LLC (Pittsburgh, Pa.), as a mixture of gramicidin A, B, and C. Synthetic phospholipids as chloroform solutions (>99% pure) can be used without further purification.

Preparation of spin-labeled gramicidin A and lipid bilayers can include a mixture of gramicidin A, B, and C containing ~85% of gramicidin A covalently modified at the C-terminus with 3-carboxy-proxyl using a modified literature procedure. After completing the reaction the mixture can be diluted with water, the precipitate formed can be collected on a filter, washed with 5 ml of water, dried on air, re-dissolved in a mixture $CHCl_3:CH_3OH$ (95:5 v/v), and the crude product can be separated on a preparative SiliaPlate Extra Hard Layer TLC plate (Silica gel 60 Å F254) using $CHCl_3:CH_3OH$ (95:5 v/v) mixture as an eluent. The band corresponding to spin-labeled gramicidin A can be verified by mass spectrometry. The peptide can be re-purified on a preparative TLC plate (Silica gel 60 Å F254; Merck KGaA, Darmstadt, Germany) with the same $CHCl_3:CH_3OH$ eluent. Spin-labeled gramicidin A was reconstituted into multilamellar DMPC (1,2-dimyristoyl-sn-glycero-3-phosphorylcholine) lipid bilayers using a literature procedure. Multilamellar lipid bilayers (10% to 25% lipids by weight) can be prepared from DMPC and DOPC (1,2-dioleoyl-sn-glycero-3-phosphocholine). DOPC bilayers can be doped with 1 mol % of 5DSA.

Figure 4:
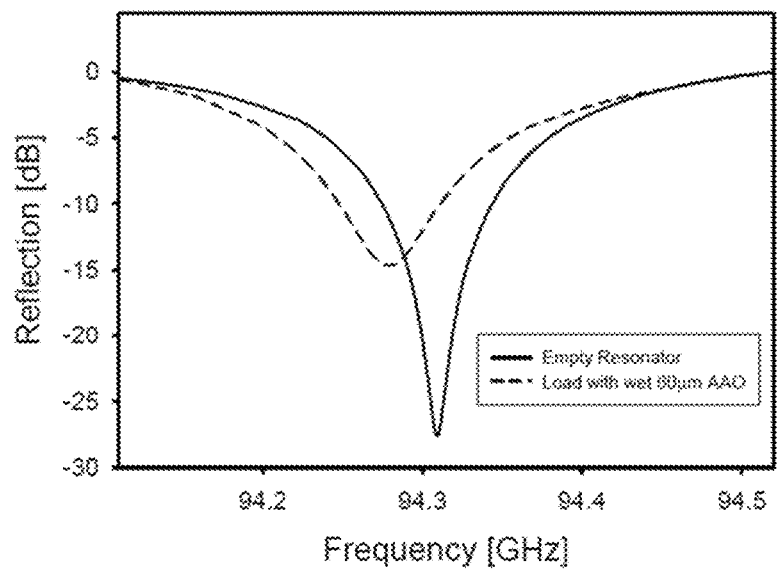
FIG. 4 is a graph that illustrates tuning curves for an example PBG resonator according to the present disclosure.

FIG. 4 can show example tuning curves for an empty resonator (solid line) and after loading with a nanoporous Whatman AAO disc (height h=60 μm, diameter d=12 mm) soaked with water (dashed line). The total volume of water inside nanopores is ≈5 μl. Experimental Q-factors can be 520 and 450, respectively.

The resonator assembly shown in FIG. 3 can allowed for various 1D photonic crystal arrangements. The following four are example arrangements: 1) Total of eight alternating $\lambda/4$ discs composed of yttria stabilized zirconia (YTZP) and alumina, 2) Total of eight alternating $\lambda/4$ discs composed of YTZP and aluminum nitride (ALN), 3) Three quartz $\lambda/4$ discs with three 0.75 mm air gaps in between (the gaps can be formed by inserting thin Rexolite rings). 4) Total of ten alternating $\lambda/4$ YTZP and quartz discs. For all the photonic crystal periodic arrangements, the layer closest to the sample and the reflective mirror can be the one with the smaller dielectric constant.

FIG. 4 is a graph that illustrates tuning curves for an example PBG resonator. These can be tuning curves for an empty "split" PBG resonator designed to operate at around 94.3 GHz (W-band). The graph shows two curves for the reflected power vs. frequency for an empty resonator formed within a metal enclosure and the same resonator loaded with an nanoporous AAO disc containing water (e.g., approximately 2-4 μl per d=12 mm disc). In each case, an 8-layer dielectric structure can include alternating $\lambda/4$ discs of YTZP (Yttria Stabilized Zirconia) and alumina. Based on these measurements the Q-factor of an empty resonator can be about 520. The Q-factor can decrease to about 450 when a water-loaded AAO disc was inserted into the resonator, as shown by the dashed line. The y-axis uses a dB scale.

The PBG resonator in the examples can include a varactor-controlled GUNN oscillator (VCO) operating at 94-95 GHz and a homodyne test bridge. The reflected mmW power can be measured by an unbiased W-band detector based on a Shottky diode and connected to a Tektronix DPO 7000 series oscilloscope. The resonance mode can be observed when the distance between the mirror and the multilayered dielectric structure is ≈$\lambda/4$ (i.e., half of the thickness of the ≈$\lambda/2$ defect). Other higher-order minima can also appear separated by ca. $\lambda/2$ distance intervals. FIG. 4 shows two experimental curves for the reflected power vs. frequency for an empty resonator and when loaded with a Whatman™ AAO disc containing approximately 5 μl of water at room temperature. In both experiments the PBG structure can be formed by 8 alternating $\lambda/4$ discs of YTZP and alumina housed inside an aluminum holder. Based on reflected mmW power measurements, the Q-factor for an empty YTZP/alumina resonator can be ≈520. The Q-factor has decreased slightly to ≈450 when a water-containing AAO disc can be loaded into the resonator. The Q-factors for empty YTZP/ALN and quartz/air PBG resonators can be ≈400 and ≈250 respectively. Experimental Q-factors can be much lower than Q≈2,500 obtained from simulations that assume a pure $TE_{11}$ input mode. This can result from a suboptimal performance of the standard gain conical gain horn as the resonator excitation source. The mmW front can be expected to be highly curved at the horn output, thus causing unwanted interferences and reflections inside the PBG resonator. Misalignments and geometric imperfections of the resonator components can also result in losses. Such misalignments can cause unwanted scattering of the mmW field inside the resonator and also excite some spurious modes.

A moderately small decrease in the experimental Q-factor can be observed when the resonator is loaded with a highly lossy aqueous sample of several microliters volume. The nanoporous ceramic AAO nanopores developed for liquid aqueous samples can provide for the disc flatness at the micron scale and such a shape can result in the shown resonator performance. The AAO disc can be replaced by a tiny semispherical water droplet, and the resonance "deep" in the reflected signal can vanish immediately, thus, indicating a dramatic loss in the Q-factor. The observed Q-factor loss can confirm that the resonant mmW field can be excited at the defect site of the photonic crystal. This can be consistent with the sample location being in the vicinity of the resonant mmW $E_1=0$ node and demonstrated overall tolerance of the resonator structure to small sample holder imperfections.

By using eq. (13) to convert the example Q-factor of the resonator loaded with a liquid aqueous sample we can obtain for the equivalent resonator finesse $\mathcal{F} \approx 120$. This value of $\mathcal{F}$ can be higher than the finesse reported to date for FP EPR resonators loaded with lossy biological samples. The gain in finesse can be observed for the PBG resonator based on (i) an efficient confinement of the mmW energy within the photonic structure defect, (ii) an effective separation of the $E_1$ and $B_1$ fields, and (iii) a rapid decay of the mmW field within the dielectric structure away from the defect (cf. FIG. 2A and the corresponding discussion), among other factors.

Figure 5:
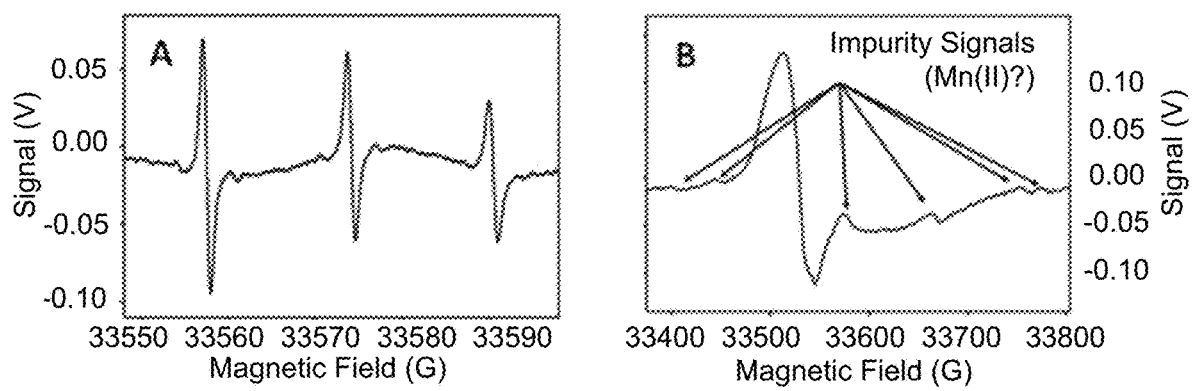
FIGS. 5A-5B are graphs that illustrate spectra of example solutions measured using an example PBG resonator according to the present disclosure.

FIGS. 5A-5B are graphs that illustrate spectra of example solutions measured using an example PBG resonator. A "split" PBG resonator for continuous wave (CW) EPR spectroscopy using 94.3 GHz (W-band) electromagnetic radiation can be used. FIG. 5A shows single-scan continuous wave (CW) EPR spectra of 1 μM (one micromolar) aqueous Tempone (4-oxo-2,2,6,6-tetramethylpiperidine-N-oxyl, is a stable nitroxyl radical compound) solution. FIG. 5B shows single-scan CW EPR spectra of 1 mol % spin-labeled 5-doxyl stearic acid (2-(3-carboxypropyl)-4,4-dimethyl2-tridecyl-3-oxazolidinyloxy, free radical) incorporated into nanopore aligned DMPC (1,2-dimyristoyl-sn-glycero-3-phosphorylcholine) lipid bilayer at 19° C. (below main phase transition of the lipid bilayer). "Split" PBG resonator can be formed from YTZP-ALN (Yttria Stabilized Zirconia and Aluminum Nitride) discs. CW EPR spectra can be measured using time constant of 1 s and 100 kHz modulation of magnetic field having 0.8 G in amplitude. Baseline can be due to the remaining paramagnetic impurities in the ceramic materials.

Figure 6:
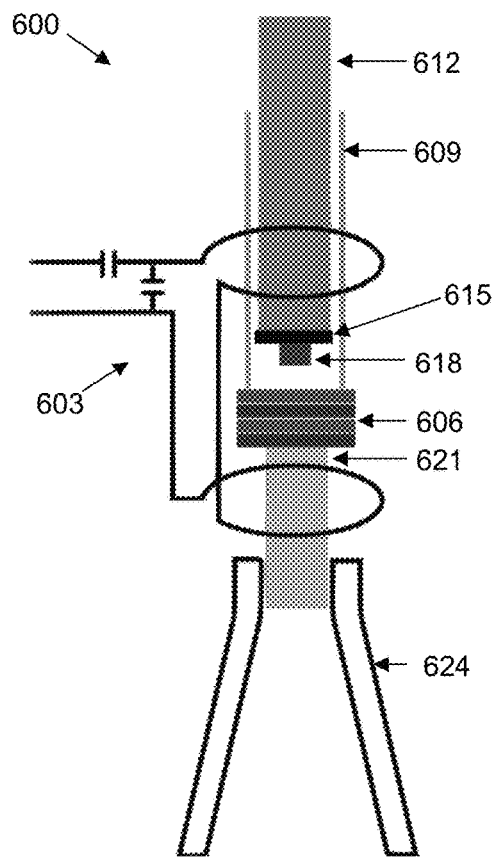
FIG. 6 is an illustration of an example PBG resonator according to the present disclosure.

FIG. 6 is an illustration of an example PBG resonator 600 according to the present disclosure. The PBG resonator 600 can illustrate one of the possible implementations for a "split" PBG resonator for an irradiation of a specimen with electromagnetic field at EPR frequency of about 200 GHz and an NMR Double Saddle coil 603 probehead tuned to about 300 MHz NMR frequency for DNP-enhanced NMR spectroscopy. In the provided example, the Teflon insert can push a 1D Photonic Crystal 606, which can be a ceramic stack made of three (3) YTZP and three (3) AlN round plates of 6.7 mm in diameter against a quartz tube 609. The choice of quartz as the tube material was made based on low level of magnetic impurities and chemical composition that does not have spin-bearing species that are targets of typical EPR experiments (free radicals and paramagnetic metal ions in case of EPR and proton, carbon, nitrogen, fluorine, and phosphorous in case of EPR). The quartz tube 609 can provide a mechanical support for the NMR Double Saddle coil 603. A movable plunger 612 can be fabricated from Macor ceramics (as one of the possible plunger materials) and can be covered with a reflective surface 615 like a flat or curved mirror that can be made out of aluminum foil or another foil or another material at one end of the plunger (e.g., towards a sample 618). The sample 618, such as a flat specimen, can be directly attached to the reflective surface 615. For this implementation of the spilt PBG resonator, the resonance frequency can be adjusted by moving the plunger 612. In one example, the electromagnetic field can be focused into the resonant PBG structure via an insert 621 and a microwave taper 624. The insert 621 can be a Teflon rod or an insert made of polytetrafluoroethylene (PTFE) or another low-loss fluoropolymer or material. Other focusing approaches, such as the use of other dielectric materials instead of Teflon, specialized metallized horns, quasi-optical lenses, and the Bragg reflector, represent other implementations.

FIGS. 7A-7B are graphs that illustrate performance of the example PBG resonator of FIG. 6 according to the present disclosure. FIG. 7A shows performance of a "split" PBG resonator like the PBG resonator 600 shown in FIG. 6 at 100 µW incident power of about 200 GHz electromagnetic radiation. The specimen includes an industrial synthetic single crystal diamond with dimensions 3.0×3.0×0.3 mm$^3$ and with various compositions of the PBG resonator and the probehead components described for FIG. 6. The PBG stack of ceramic discs can provide a several-fold increase in the DNP efficiency and the amplitude of the NMR signal even at low power levels of 200 GHz radiation. FIG. 7B shows results for a single crystal diamond. A DNP gain of $^{13}$C NMR signal for the single crystal diamond can be about 1,600-fold at about 100 mW of power of 200 GHz radiation vs. direct excitation of $^{13}$C NMR (i.e., with 200 GHz radiation switched off).

Figure 8:
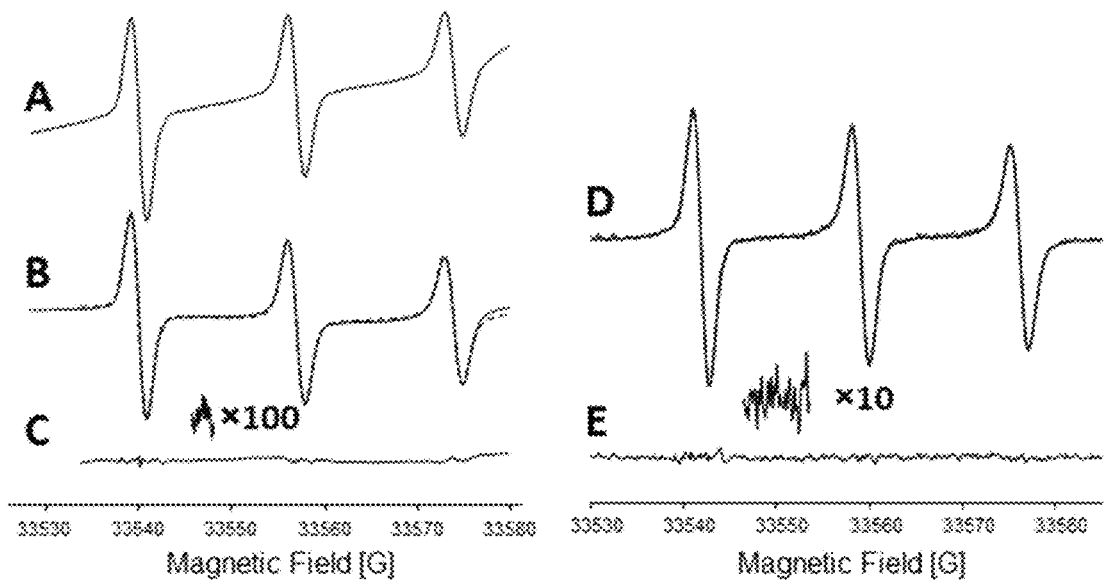

FIG. 8 includes example graphs that illustrate CW EPR of liquid biological samples at room temperature using W-band PBG resonator. Various tests of a "split defect" PBG resonator for a series of liquid aqueous solutions and hydrated lipid bilayers can be performed. For example, a comparison of the PBG resonator performance vs. that of a high-Q cylindrical $TE_{012}$-mode cavity tuned to ca. 94.3 GHz (W-band) can be performed. Some experiments can use the same homodyne W-band bridge and superconducting magnet system using 100 µM aqueous solution of nitroxide Tempol. For the PBG resonator the total volume of Tempol aqueous solution occupying AAO nanopores can be ≈5 µl although the active volume can be expected to be about half of that. The active volume of the aqueous sample inside the high-Q resonator capillary can be estimated at 63 nl. FIG. 8 shows room temperature W-band CW EPR spectra of the same Tempol solution recorded using 0.3 s time constant and 100 kHz magnetic field modulation of slightly different amplitudes: 0.8 G for the PBG tests and 0.6 G for the $TE_{012}$-type resonator. While the experimental spectrum obtained with PBG resonator can be substantially noise-free, a baseline slant can be observed in the high field region of the spectrum. Such a baseline can be attributed to paramagnetic defects in the dielectric materials (mainly in alumina discs).

As indicated, FIG. 8 shows comparison of room temperature single-scan (time constant 0.3 s) experimental EPR spectra of 100 µM aqueous solution of nitroxide Tempol obtained using a "split defect" PBG resonator (A) and a high-Q (≈3,500) cylindrical $TE_{012}$-type resonator cavity (B) and the same NCSU-built homodyne mmW bridge. These CW EPR spectra can be measured using 100 kHz magnetic field modulation with amplitude 0.8 G (A) and 0.6 G (B). The PBG resonator can be assembled from 8 alternating YTZP and alumina discs. The baseline arising from EPR signals from the dielectric stack can be corrected (B, solid line) and the spectra can be least-squares filled to a fast motion model (B, dashed line). (C) Residual of the fit, i.e., a difference between the baseline-corrected and the simulated spectra. A small portion of the fit residual can also be shown using ×100-fold amplification (D). The signal-to-noise ratio (SNR), can be the ratio of the maximum peak-to-peak signal amplitude to twice the standard deviation of the flat portion of the residual is >1,100. The spectrum using $TE_{012}$-type resonator can require no baseline correction (E) and the fit residual (E) can show little or no differences between experimental results and the fit. A portion of a residual using ten-fold amplification is also shown (SNR≈96).

The $TE_{012}$-type resonator can unload Q≈3,500 and can yield maximum EPR signals for aqueous samples when loaded into 0.2 mm i.d. quartz capillaries. Because such a resonator can be constructed from thin gold foil it can have no detectable background. Least-squares fitting does not require extensive baseline correction. Following the same procedure, SNR can be estimated at SNR≈96. Based on these estimates the "split defect" PBG resonator based on YTZP and alumina can provide at least ten-fold gain in concentration sensitivity for an aqueous solution of nitroxide radicals albeit at the cost of a background EPR signal from the alumina discs.

Figure 9:
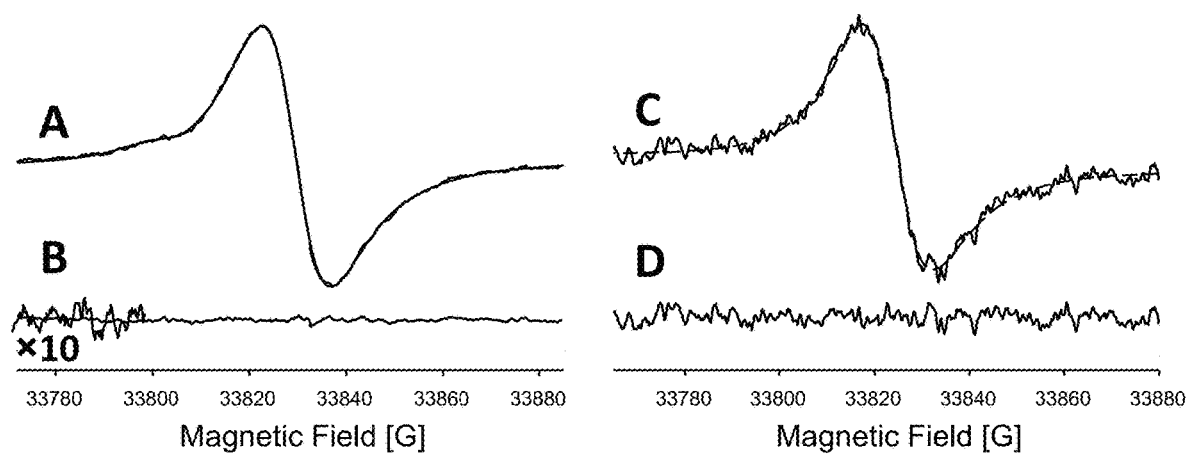

FIG. 9 includes example graphs that illustrate a comparison of room temperature single scan experimental W-band EPR spectra of 150 µM aqueous solution of $Gd^{3+}$-DOTA obtained using a "split defect" PBG resonator (A) and a high-Q (Q≈3,500) cylindrical $TE_{012}$-type resonator cavity (C). Experimental parameters can be similar to those discussed for FIGS. 3 and 4, except that the PBG resonator can be formed from 10 alternating YTZP and quartz discs and modulation amplitudes can be 0.8 G (A) and 1.0 G (C). Least-squares fits are superimposed with the spectra and the corresponding fit residuals are shown at the bottom as (B)

and (D) including a ten-fold amplified portion (B). The signal-to-noise ratios for (A) are (C) are ≈140 and ≈20, respectively.

Labeling of biological macromolecules with $Gd^{3+}$-chelates can be an alternative to nitroxides for distance measurements at W-band and higher frequencies. This can be used as a result of: (i) chemical stability of $Gd^{3+}$-based molecular tags in intracellular environment that results in a rapid reduction of common nitroxides to EPR-silent hydroxylamines and oxidation to oxoammoniums, and (ii) significant narrowing of $Gd^{3+}$ EPR line with an increase in magnetic field/frequency. Such line narrowing can result in measurements of $Gd^{3+}$ to $Gd^{3+}$ distances up to 3.4 nm by CW EPR at 240 GHz and 30 K. EPR distance measurements based on evaluation of $Gd^{3+}$ linewidth broadening can benefit from moving from cryogenic (e.g., 30 K) to higher temperatures and from having a better signal-to-noise ratio.

Measurements of an aqueous solution of typical $Gd^{3+}$ complex Gd-DOTA using "split-defect" PBG resonator can be compared that with cylindrical $TE_{012}$-type resonator cavity at room temperature. Concentration of Gd-DOTA can be 150 µM, which can be a lower concentration than utilized for other technologies. In order to decrease the resonator background EPR signal, the photonic crystal can be formed from 10 alternating YTZP and quartz plates. Room temperature single-scan EPR spectrum from 150 µM aqueous solution of Gd-DOTA did not require baseline correction and demonstrated an excellent SNR≈140 (FIGS. 9A and B). In comparison, single-scan W-band spectrum from the same of Gd-DOTA solution but measured using $TE_{012}$ resonator revealed a noticeable noise and SNR of only ≈20 (FIGS. 9 C and D). The spectrum of FIG. 9A can be recorded at modulation amplitude of 0.8 G, that can be significantly smaller than 3.5 or 7.0 G that can be applied for this signal with ≈14.5 G peak-to-peak linewidth.

The incident microwave power the detector voltage corresponding to the EPR signal can be proportional to the product (Q·η), where η is the resonator filling factor. The detector voltage corresponding to the EPR signal at the same incident mmW for the two loaded resonators, on comparison, can show that (Q·η) of the PBG structure can be at least fourfold higher when compared to the $TE_{012}$ cavity. The result can be from the filling factor η in the former case that can overweighs a decrease in the Q-factor. The even more favorable signal-to-noise ratio observed for the PBG resonator can be related to the resilience of the mostly dielectric PBG structure to "microphonic" noise which can be observed for the fundamental mode (FM) n-moded volume resonators because of their metallic structures and very high Q-factors (≈2,000-3,000 even for the loaded resonators). The high-Q cavities can also effectively convert phase noise of the mmW sources into amplitude noise, thus decreasing the benefits of operating at higher mmW power level and imposing strict requirement on mmW oscillators. For example, the signal-to-noise ratio of EPR spectra detected with $TE_{012}$-type cylindrical resonator do not improve upon increasing the incident mmW power above ca. 0.3 mW. However, no microphonic noise and/or the noise from the mmW oscillator can be observed with the PBG resonator at the maximum 20-22 mW power.

The PBG resonators built using YTZP-Alumina dielectric layers demonstrate the high Q-factors but can also exhibit strong background EPR signals over a broad range of the magnetic fields even at room temperature. The background signals can be much smaller in a YTZP-ALN arrangement and nearly absent for YTZP-quartz photonic crystals. Based on a comparison of experimental W-band EPR spectra the product (Q·η) can be a factor ≈1.6 smaller for YTZP-ALN structure and a factor of ≈2.8 smaller for YTZP-quartz vs. the YTZP-Alumina combination.

Figures 10, 11:
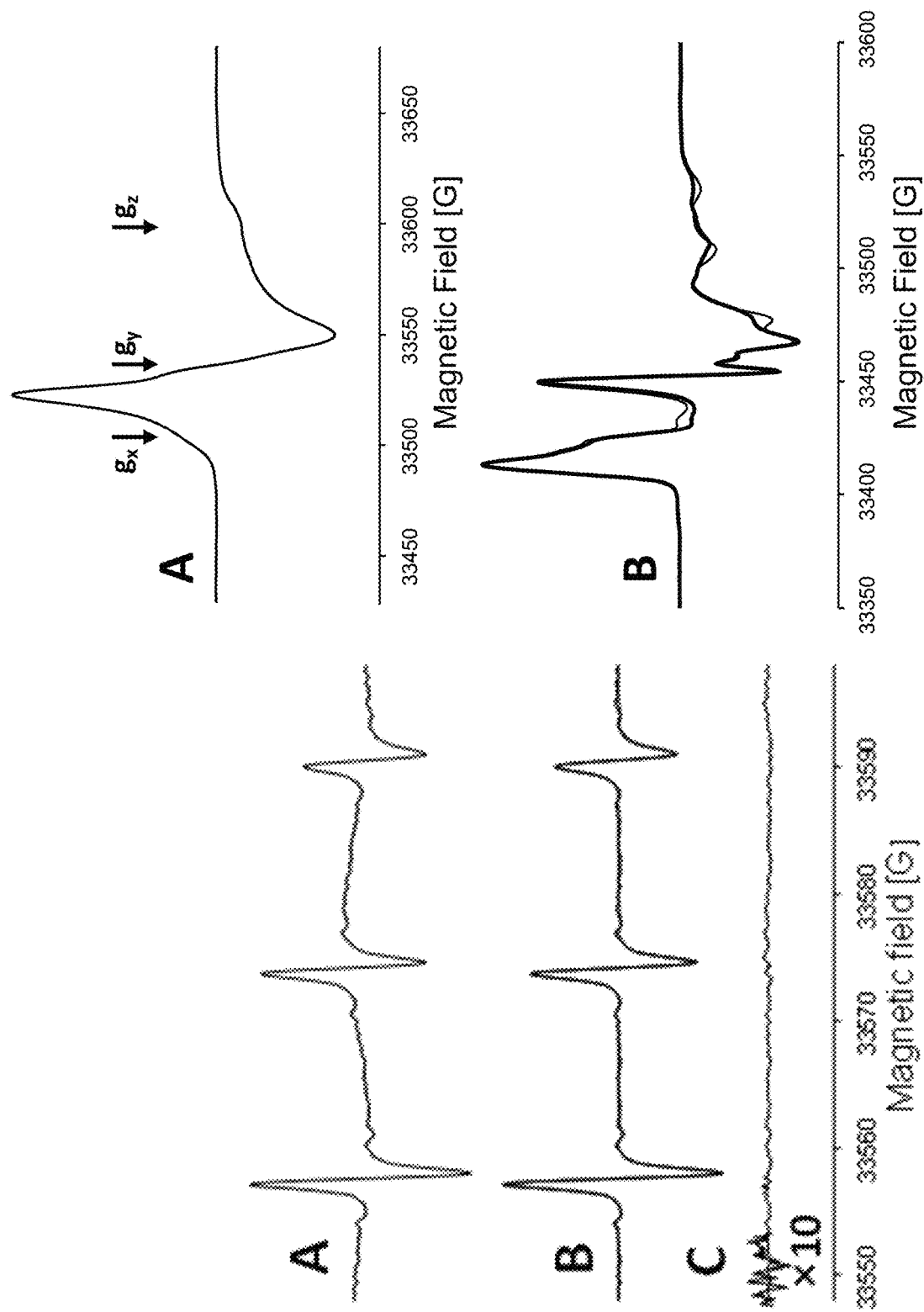

FIG. 10 includes example graphs of sensitivity test of the W-band split-defect PBG resonator for aqueous samples. FIG. 10(A) can show experimental room temperature single-scan W-band (94.26 GHz) EPR spectrum of 1 µM aqueous solution of perdeuterated nitroxide Tempone can be obtained using a "split defect" PBG resonator formed by total of 12 alternating YTZP and ALN discs. The spectrum can be recorded with 100 kHz modulation with 0.8 G in amplitude, time constant of 1 s, and 21 mW of incident power. The broad background can be filtered out and can result in a spectrum (B) using least-squares fitted to a fast motion model. The fit residual (C) can show little or no significant deviations between the experimental results and the fit after background filtering/subtraction. A portion of the fit residual (C) can be shown in ten-fold amplification. Signal-to-noise ratio can be SNR≈103.

The sample can be made from 1 µM aqueous solution of perdeuterated nitroxide Tempone in water soaked and sealed within a Whatman AAO sample holder. In order to suppress background EPR signals from the ceramics, the photonic crystal can be formed by alternating 6 YTZP and 6 ALN discs. While the background is still detectable, it can be significantly smaller than the one observed for YTZP/alumina resonator. The concentration of nitroxide in FIG. 8A is 100-fold greater than in FIG. 10A. This demonstrates a proportional >100-fold decrease in the resonator background signals can be achieved with YTZP/ALN structure. The nitroxide EPR signal that can be obtained using this YTZP/ALN structure can be, by a factor ≈1.5, smaller than measured with 8 disc YTZP/alumina photonic crystal. Shown in FIG. 10, fast motion EPR signal from nitroxide in liquid water can be detectable using a single scan at concentrations as low as 1 µM with an excellent signal-to-noise ratio (SNR≈103). While the broad EPR signal originating from YTZP/ALN discs can be detectable, it can be readily filtered out from the sharper nitroxide lines using the methods described in literature. The resulting spectrum can be least-squares fitted to a fast motion model with the fit residual demonstrating the appropriateness of both background correction and the EPR spectra fitting procedure.

While other nanoporous and mesoporous materials can be employed as the sample holders for liquid samples in PBG EPR resonators, nanoporous AAO membranes can serve as an alignment media for lipid bilayers and membrane proteins. DOPC lipid bilayers doped with 1 mol % of EPR membrane probe 5-Doxyl stearic acid radical (5DSA) can be deposited into an in-house fabricated AAO disc. The nanopores can be filled with an excess of water and sealed.

FIG. 11 shows an example graph of a single-scan W-band EPR spectra of fully hydrated spin-labeled samples macroscopically aligned by nanochannels of in-house fabricated AAO holder. (A) EPR spectrum of nanotubular DOPC bilayers doped at 1 mol % 5DSA and aligned by AAO nanopores at 19° C. Approximate positions of the principal axis g-matrix components are indicated by arrows. (B) EPR spectra of spin-labeled dimeric gramicidin. A channel can be formed in nanotubular DMPC at 25° C. AAO nanopores can be filled with either water (thin line) or 2.4 M aqueous KCL solution (thick line) which can result in double occupancy of $K^+$ in the dimeric gA channel. Spectra can be measured with a 6 disc YTZP/ALN resonator using is time constant and 0.8 G modulation amplitude.

A room-temperature single scan W-band EPR spectrum of the sample obtained with the 6-disc YTZP/ALN resonator can be substantially noise-free. The spectrum can be consistent with a 5DSA molecule oriented so that the nitroxide magnetic z-axis is perpendicular to the external magnetic field and undergoing a rotational motion about z-axis resulting in a partial averaging of $g_x$ and $g_z$ spectral features (positions of the axis g-matrix components are indicated in FIG. 11A). Such an orientation and rotational dynamics of 5DSA can result upon partitioning in lipid nanotubular bilayers confined by AAO nanochannels with pore axes directed along the external magnetic field $B_0$ and the bilayer director being perpendicular to $B_0$.

Another example of the general utility of our PBG resonator can be provided by W-band EPR spectra of spin-labeled gramicidin A (sl-gA) channel formed in DMPC lipid bilayers. gA is a 15-residue polypeptide which dimerizes in the bilayer to form a membrane-spanning pore of 4.5-Å in diameter pore accommodating ions and a single file of water molecules. The dimer can be formed in lipid bilayers, such as those composed of DMPC, which can provide the proper hydrophobic match for the right-handed β-helix. Previous X-band (9 GHz) EPR studies of gA with the free hydroxyl at the C-terminus labeled with a nitroxide can show not only anisotropic rotational dynamics of the nitroxide molecular tag but also sensitivity of the EPR spectra to the so-called diffusion-tilt angle, i.e., the angle between the main rotation diffusion axis of the molecule and the magnetic z-axis of the nitroxide. The latter data were obtained for planar DMPC lipid bilayers that were macroscopically aligned by isopotential spin-dry ultracentrifugation (ISDU). FIG. 11B can show W-band EPR spectra of gA labeled as at the same position and incorporated into the same DMPC bilayers. The macroscopic alignment of lipid bilayers in AAO nanochannels can provide for the perpendicular orientation of the director vector of the lipid bilayers with respect to $B_0$. The spectra measured at 25° C. (i.e., above the main phase transition of DMPC bilayers that remains largely unaffected by the nanopore confinement) can show a high degree of macroscopic alignment for the nitroxide probe with $g_z$ spectral features suppressed in comparison with $g_x$ and $g_y$ components (FIG. 11B). Relative changes in the component intensities can also be observed with X-band EPR as measured at the perpendicular orientation of the bilayer aligned by glass plates.

Excellent signal-to-noise ratio and a negligible contribution from the resonator background can allow for observing changes in W-band EPR spectra of sl-gA when the gA/DMPC-loaded AAO disc is exposed to 2.4 M KCl (cf. thin and thick line EPR spectra in FIG. 8B). Such an exposure can generate approximately double occupancy of $K^+$ in the dimeric gA channel, or one ion per monomer, and can result in a conformational change involving at least the channel. This manner of change affects the nitroxide diffusion-tilt angle reflected in high-resolution W-band EPR spectra of sl-gA as can be observed in FIG. 11B.

Photonic band-gap resonators can be useful for a wide variety of applications including: (i) CW and pulsed high field/high frequency (HF) EPR of aqueous biological samples having a few μl in volume using low-power cost-efficient mmW sources without the need for expensive tube-based devices like EIKs, and TWTs capable of generating up to ca. 1 kW power; (ii) Improving concentration sensitivity of HF EPR by at least tenfold even for liquid aqueous samples; and (iii) Studies of soluble and membrane proteins labeled with nitroxides and $Gd^{3+}$ chelates that are currently hampered by low sensitivity of the existing high field EPR probeheads.

Compared to single-mode EPR cavities, 1D photonic band-gap resonators can accommodate much larger sample volume by increasing the resonator diameter while maintaining the overall flatness of the sample required for its performance. Potentially, the PBG structure could incorporate multiple defects allowing for multiple sample layers, thereby further increasing the sample volume. The use of materials with very high dielectric constants and low losses can make the size of the resonator comparable to the dimensions of the aqueous sample layer and eliminate the background signal from the resonator. In addition, the PBG resonator design can be employed for the development of integrated probeheads for simultaneous excitation and detection of both the electronic and nuclear spins. This can include combined radiofrequency/mmW probeheads for ENDOR, liquid-state DNP and DNP-enhanced studies of membrane proteins by solid-state NMR and EPR at essentially the same experimental setting and at room temperature.

Figure 12:
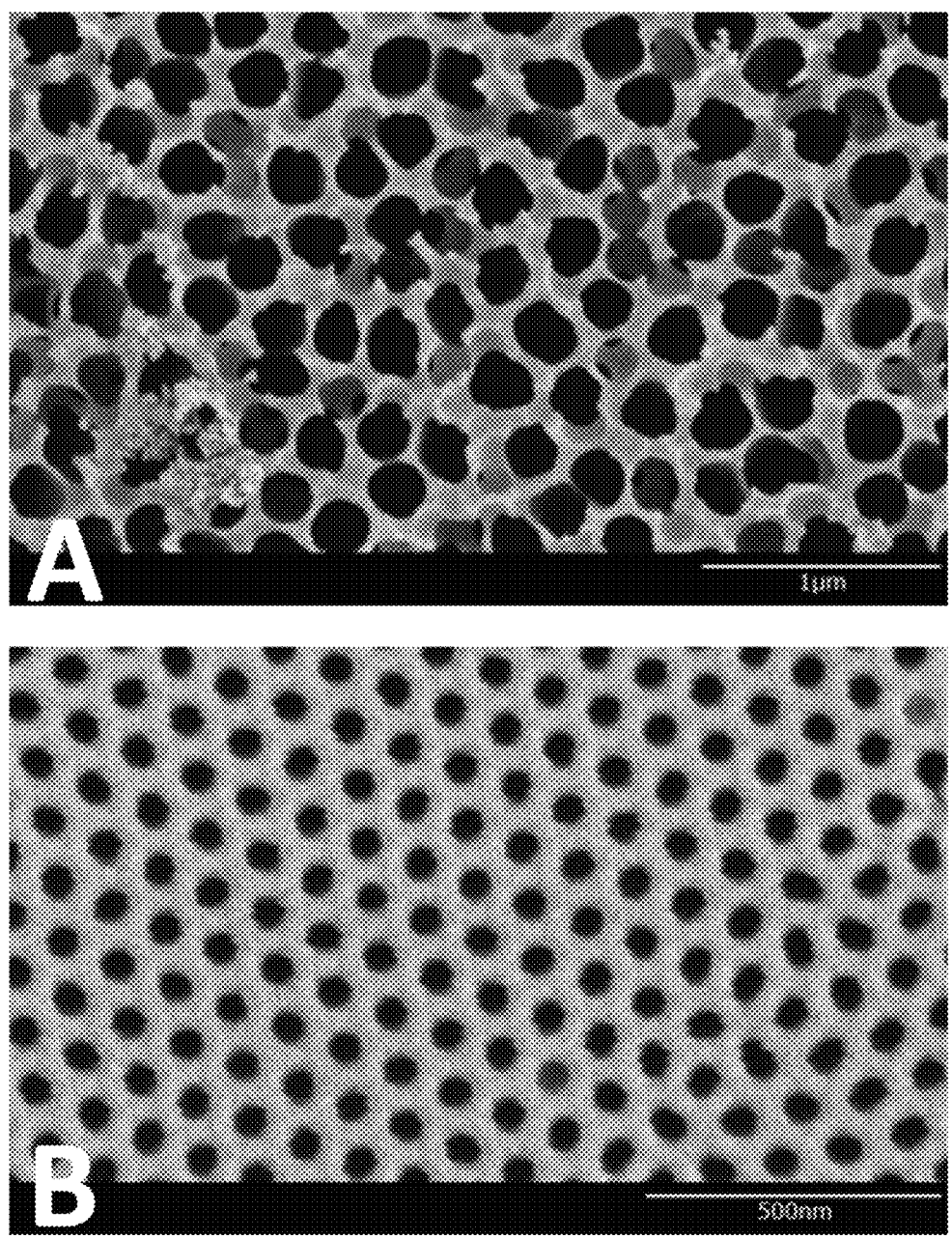
FIG. 12 is an image that illustrates an example nanoporous membrane to hold samples for PBG resonators according to the present disclosure.

FIG. 12 shows images of example AAO sample holders. Two types of nanoporous AAO membranes of different porosity and pore morphology are shown as example sample holders for liquid model biological samples. For example, (A) shows Whatman Anodisc membranes having ca. 60 μm in thickness. Examination of these substrates with SEM can show a disordered pore morphology with pore diameter d=245±−38 nm and porosity of 48%. Experiments with lipid bilayers and membrane peptides can be carried out with AAO exhibiting a highly homogeneous pore morphology and fabricated. The latter substrates can be ca. 50 μm thick, and can have average pore diameter of d=54.2±2.4 nm and porosity of 25% as shown in FIG. 12B.

As indicated, FIG. 12 shows representative SEM images of Whatman Anodisc (A) and in-house fabricated AAO (B). From analysis of larger scale images, the average pore diameters and porosity can be d=245±38 nm and 48% for (A) and d=54.2±2.4 nm and 25% for (B), respectively. Larger pieces of the AAO substrates can be annealed to ca. 700° C. to decrease background EPR signals down to the noise level and then laser-cut into o.d.=12 mm disks forming nanoporous containers for aqueous samples. Liquid samples can be deposited into AAO nanochannels by capillary action since the alumina surface is hydrophilic while macroscopically aligned lipid nanotubular bilayers call be formed by self-assembly. The AAO disc can be placed on top of the mirror, excess of liquid can be removed by a cotton swab, and then a pre-cut o.d=13.5 mm disc of fluorinated ethylene propylene (FEP) tape with a silicone adhesive (2 mil thickness) can be placed on the top of the disc to seal the sample. Any remaining excess of liquid can be squeezed out and the edges of the disc can be additionally sealed with a thin layer of silicone grease (e.g., Dow Corning® high vacuum grease). In some aspects, no sample drying can be apparent for at least 4-6 hrs. The total sample volume can be estimated by the difference in the AAO disc weight before and after the sample deposition. Accordingly, aqueous sample holders for high field EPR can be based on nanoporous anodic aluminum oxide (AAO) membranes. Furthermore, AAO nanopores can serve as a versatile mechanical alignment media for lipid bilayers and membrane proteins, thus, providing an additional gain in resolution.

Figure 13:
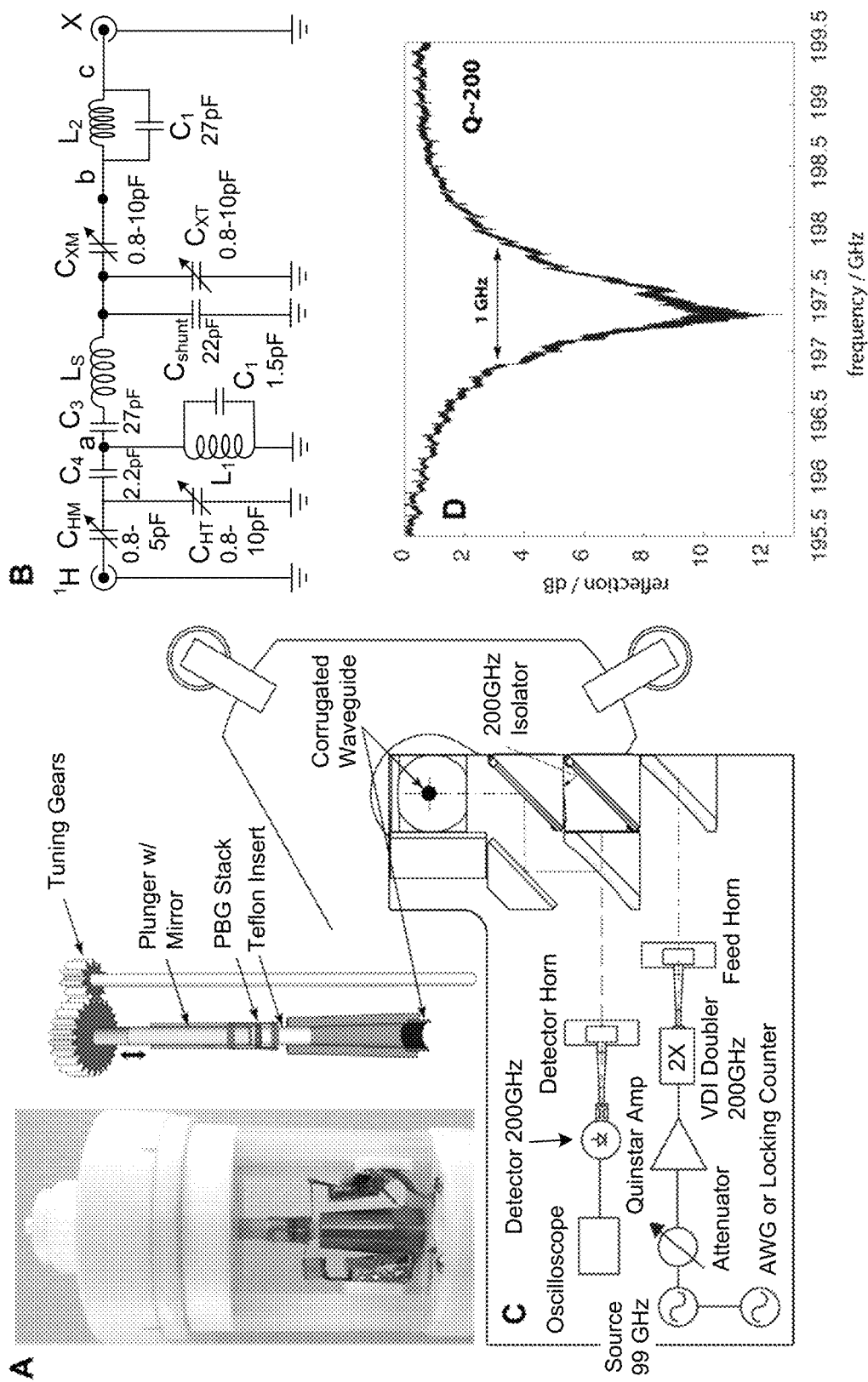
FIGS. 13A-13C include an image and illustration of aspects of an example PBG resonator for DNP according to the present disclosure.
FIG. 13D is a graph that illustrates Q factor for an example PBG resonator according to the present disclosure.

FIG. 13 shows example components of a DNP NMR probehead and a photograph of an example probe. In FIG. 13A, the photograph shows that a probehead can be assembled inside a 200 MHz NMR probe modified to insert a corrugated waveguide along the probe axis. A 7 mm double saddle coil removed from a 100 MHz $^1H$ frequency solution NMR probe can be supported by a quartz tube (i.d.=5.8 mm, o.d.=6.8 mm). FIG. 13A shows a photograph and a drawing of a multi-resonant 200 GHz/300 MHz $^1$H/75.5 MHz $^{13}$C DNP NMR probehead composed of a double tuned NMR saddle if coil and a PBG mmW resonator. mmW can be delivered via a corrugated waveguide (8 mm ID) connected to a smooth brass taper to reduce the beam width down to 6.7 mm. A Teflon insert, serving as a dielectric waveguide, can push the PBG stack against the quartz tube and can provide mechanical support for both the rf coil and the resonator. A threaded (e.g., ¼-32 thread size) Macor™ plunger can move the sample attached to a mirror inside the quartz tube enabling the resonator tuning.

In FIG. 13B, example schematics of a double-tuned rf probe circuit can be shown. As shown, an example coil can be tuned to $^{13}$C (75.4 MHz) and $^1$H (300.1 MHz) frequencies. Other component values and otherwise circuits can also be used. The 1D photonic band-gap resonator can be formed by a stack including three (3) yttria-stabilized zirconia (YTZP) and three (3) aluminum nitride (AlN) ceramic discs having 7 mm diameters with thicknesses of 210 μm and 127 μm, respectively, corresponding to ca. ¾λ and ¼λ for these materials at 200 GHz. The frequency of the resonator can be tuned by a movable plunger made from Macor and actuated by a gear connected to an external rod, cf. FIG. 8A. In some aspects, a flat round mirror (d=5.7 mm) can be formed from an industrial aluminum adhesive tape (50 μm thickness) and attached at the end of the plunger. A diamond sample can be placed on the aluminum mirror, i.e. at a location corresponding to the mmW electric field node and the maximum of the magnetic field.

FIG. 13C is a drawing that shows example schematics of a quasioptical 200 GHz platform with all active solid-state mmW components as indicated. The drawing can describe a 200 GHz/300 MHz DNP NMR spectrometer. The spectrometer can be constructed based on a 200 GHz quasioptical (QO) bridge and additional mmW components, for example, as shown in the figure. A broadband voltage-controlled W-band (90-100 GHz) solid-state source can be utilized. The source can be frequency-locked to within ±100 Hz using EIP 578B source locking microwave counter. The source output can be attenuated by a high-precision direct reading attenuator and then amplified by a high power W-band amplifier QPN-94003027-00 with $P_{sat}\approx35$ dBm (3 W) at 96 GHz. The output of the amplifier can be directed to D210XHP varactor doubler yielding up to 27 dBm (0.5 W) at ca. 192 GHz. Because of a falloff of the W-band amplifier performance above ca. 96 GHz the doubler output can be decreased to 23 dBm (<0.2 W) at 197.5 GHz. The power performance of these components can be characterized in part by using a calibrated calorimeter-style power meter. The doubler output can be coupled to a profiled corrugated horn to yield a Gaussian mmW beam directed into a series of quasi-optical mirrors towards the magnet bore. A 45° Faraday rotator in a combination with two linear polarizer grids can form an isolator for protecting the sensitive microwave components from reflected mmW power as well as for enabling future EPR detection in the induction mode. A 200 GHz detector can be coupled to the second profiled corrugated horn to monitor the reflected mmW power from the resonator deflected via 1.5 mil standard laminate film placed in front of the polarizer grid. In some aspects, all the components can be mounted on a 20 mm-thick aluminum plate for mechanical stability. Two threaded shafts can engage the movement of the QO platform in the X-Y plane to match the mmW beam waist (focal point) to the aperture of the corrugated waveguide located inside the NMR probe (cf. FIGS. 13A and 13C). The match can be monitored by measuring the reflected mmW power with an oscilloscope. The reflected signal can be also utilized for tuning the PBG resonator my measuring frequency dependence of mmW power reflected from the resonator by applying a linear voltage ramp from an Agilent arbitrary waveform generator on the varactor side of the W-band source.

FIG. 13D shows an example of an experimental PBG resonator tuning curve that demonstrates Q~200 when loaded with a diamond sample. A Bruker Biospin Avance II spectrometer equipped with a standard Bruker 7 T wide-bore 89 mm magnet parked at 300.1 MHz $^1$H NMR frequency can be employed for DNP NMR Measurements. 90-degree NMR pulses with durations of ca. 5 μs can be obtained at rf powers of ca. 100 W and 250 W on the $^1$H and $^{13}$C channels, respectively, allowing for standard cross-polarization experiments. A series of saturating 90-degree pulses can be applied before the DNP transfer to the $^{13}$C spins. DNP experiments can be conducted by applying mmW in a continuous fashion. Output mmW power at different locations along the quasioptical path can be monitored using an Ophir™ 3A-P-THz power meter. The meter can provide approximate readings at ca. 200 GHz because it can be calibrated (e.g., by the manufacturer) at the lowest frequency of 300 GHz. A single crystal of high-pressure high-temperature (HPHT) synthetic diamond having the size of 3×3×0.3 mm (2.7 μL total volume) can be mounted directly on the resonator mirror with a thin layer of silicone grease. The crystal can be specified to have P1 vacancies at <200 ppm level, which can serve as an efficient source for the electronic spin polarization. Experiments and measurements shown in FIG. 8 were carried out at room temperature.

Various aspects can incorporate a one-dimensional (1D) photonic band-gap (PBG) resonator operating at mmW frequencies constitutes. Photonic crystals have been employed in optics but not in mmW systems. A 1D photonic crystal can be formed as a periodic ¼λ stack of flat dielectric layers with alternating dielectric constants (high and low). A broad frequency range (or band gap) can be created, for example, where transmission of electromagnetic waves is forbidden along the crystal dimension. For the frequencies within the band gap, a defect in the periodic structure can confine electromagnetic waves within its location, thus creating a resonant structure. The resonant frequency can be determined by the width and dielectric properties of the defect, and can be fine-tuned by adjusting the thickness of the defect layer. In some aspects, the defect can be symmetric. The mmW electric $E_{1e}$=0 node and the position of the maximum amplitude of the magnetic $B_{1e}$=0 component can be located right in the middle of the defect. Alternatively, a resonant structure can be formed by placing a metallic mirror in the middle of the defect and using only one-half of the dielectric stack. This can simplify the resonant structure, however, at the cost of a twofold sample volume reduction as well as an additional mmW absorption by the metallic mirror due to its electric resistance. In such a simplified version of a PBG resonator, the sample can be placed directly on the mirror, i.e. within the electric $E_{1e}$=0 node in order to minimize the dielectric losses and maximize the DNP effect.

Figure 14A:
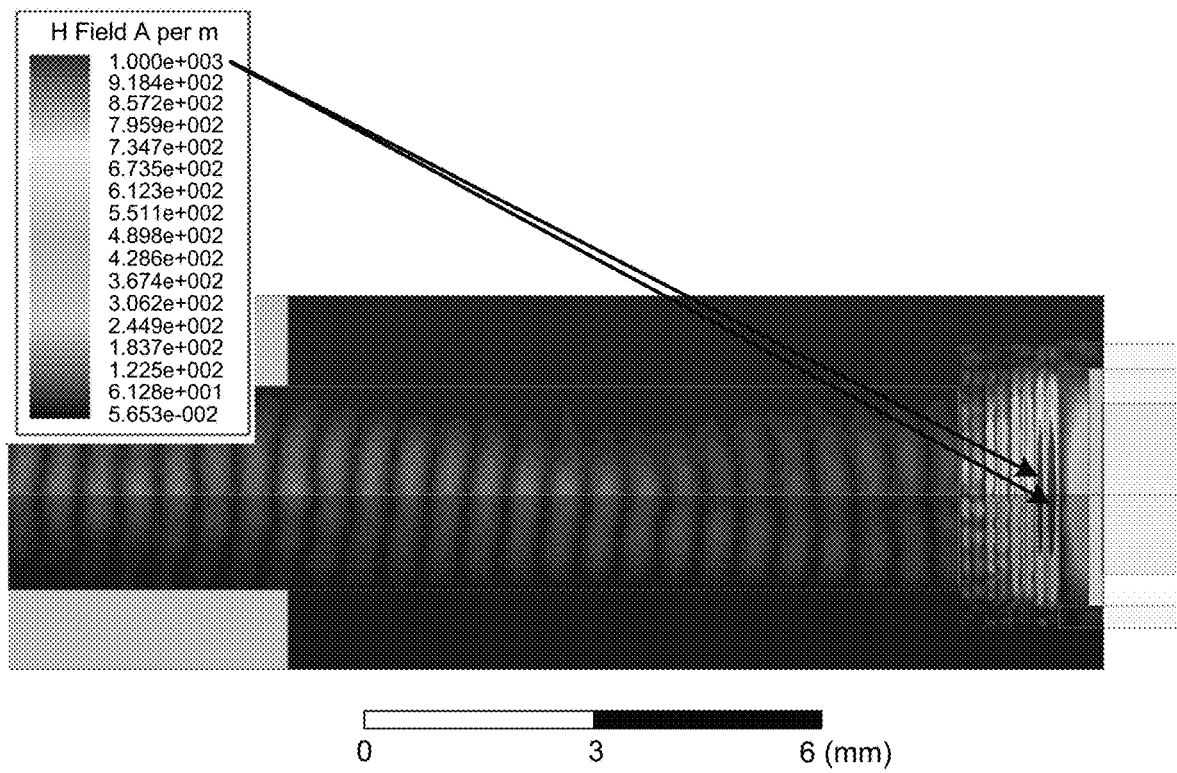
FIG. 14A is an illustration of electromagnetic fields of an example PBG resonator according to the present disclosure.

FIG. 14A shows example simulations of the mmW field in the empty 200 GHz PBG resonator DNP NMR probehead. The maximum magnetic fields amplitudes of ca. $H_1$=7.0× $10^2$ A/m or $B_{1e}$=0.88 mT at the sample were calculated with the input power to 4 W. The distribution of mmW field inside the PBG resonator can be simulated using HFSS software. These simulations can include a realistic configuration of the actual resonator, which can include the Teflon insert as a short dielectric waveguide element (which also helps to avoid NMR rf coil arcing), and a PBG ceramic stack consisting of four $3/4\lambda$ YTZP and four $1/4\lambda$ AlN discs.

Figure 14B:
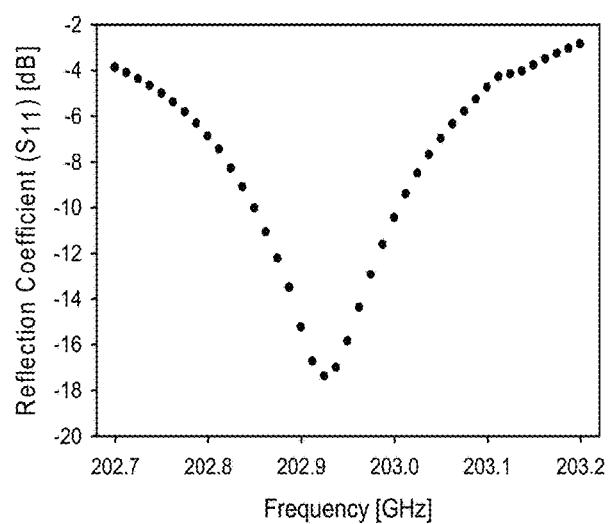
FIG. 14B is a graph that illustrates a reflection coefficient for an example PBG resonator according to the present disclosure.

FIG. 14B shows an example simulated $S_{11}$ reflection coefficient curve. In some cases, the reflection curve can indicate Q=500. In some aspects, neither a significant conversion of the desired mmW mode nor a distortion of its front flatness is revealed by simulation. In practice, however, imperfections of the geometry and a slight misalignment of the components can result in a partial excitation of less favorable modes and wave-front distortions. As expected, such imperfections can decrease Q-factor of the constructed resonator prototype. Experimentally, it can be also determined that decreasing the number of the dielectric discs to three (3) YTZP and three (3) AlN can improve the resonator coupling and Q-factor. Q-factor of ca. 200 can be achieved for the 200 GHz PBG resonator loaded with the diamond crystal, even though such a sample can have suboptimal geometry (i.e., rectangular but not circular shape and the thickness of 0.3 mm that greatly exceeds $1/4\lambda \approx 0.157$ mm for this material at 200 GHz).

The predominant mode of the 1D PBG resonator can be analogous to the $TEM_{001}$ mode in the FP cavity. Analogs of the higher-order $TEM_{00n}$ modes can also be excited if the separation between the dielectric stack and the aluminum mirror is increased. These modes can be observed as additional minima of the reflection coefficient when the stack-to-mirror distance is increased by the multiples of ca. $\lambda/$, for example, as can be estimated from counting the number of the turns of the plunger and the thread pitch. Periodic minima can be a function of the sample position, which is consistent with 1D structure of the PBG resonator. While the optimal performance of FP resonators can be achieved at higher $TEM_{00n}$ modes, the observed Q-factor of the PBG resonator can decrease with the increasing air gap i.e. when higher modes are excited. DNP experiments can show that a first observed mode can provide the strongest mmW $B_{1e}$ field at the location of the defect. In such a configuration, the mirror with the sample can be closely positioned to the PBG stack and the mmW scatter can be minimized Importantly, the simulated reflection coefficient at the center of the resonator mode can be −18 dB, indicating a nearly critical coupling to the incident mmW beam.

Varactor-tuned solid-state mmW sources and solid-state power amplifiers and doublers, when employed together with quasi-optical bridge design, can have more than sufficient bandwidth for DNP NMR using different paramagnetic centers/free radicals as the sources for spin polarization. Some aspects can include a frequency range from 188 to 198 GHz, which can be limited by the bandwidth of the W-band power amplifier but not the doubler. The power output of the amplifier can be observed to drop above ca. 96 GHz. Thus, the operation of the DNP system above 96×2=192 GHz can yield significantly lower incident powers but allowed for conducting natural abundance $^{13}C$ DNP, for example, with synthetic diamond crystals containing P1 centers using a Bruker superconducting magnet parked at the magnetic field of 7.04925 T corresponding to the standard 300.130 MHz $^1H$ NMR frequency.

Figure 15:
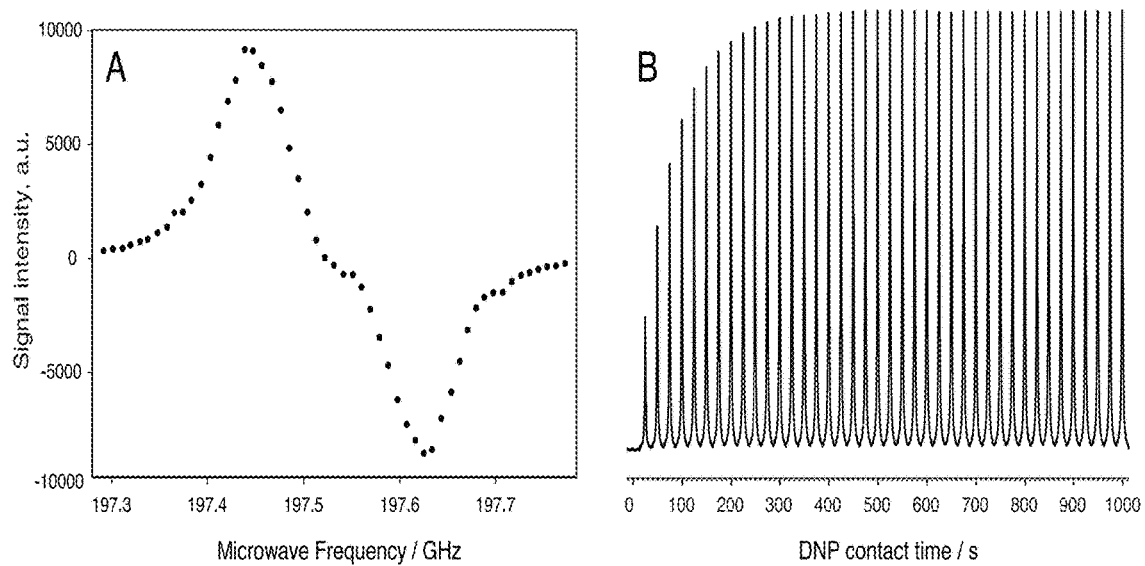
FIGS. 15-19 are graphs that illustrate performance of example PBG resonators according to the present disclosure.

FIG. 15 shows and example of amplitude and the signal buildup of DNP-enhanced natural abundance $^{13}C$ NMR resonance. The example shown can result from a monocrystalline HPHT diamond measured using PBG resonator at room temperature. FIG. 15A shows an example DNP enhancement profile measured as $^{13}C$ signal amplitude vs. mmW frequency at the contact time of 30 s. FIG. 15B shows an example DNP buildup as a function of the contact time at an optimal frequency 197.44 GHz which can exhibit DNP saturation at ca. 400 s. FIG. 15 can refer to a DNP profile for the single crystal HPHT diamond inside the PBG resonator as a function of mmW frequency at the maximum incident power of ca. 150 mW when measured at the end of the corrugated feed horn coupled to the doubler. The shape of the profile can be approximately symmetric showing both negative and positive DNP enhancements. At these power levels the DNP effect in the diamond crystal can be saturated and, therefore, a small change in the incident mmW power with increasing the frequency very little or no effect on magnitude of the DNP enhancement. Furthermore, ≈1 GHz bandwidth of the PBG resonator (Q≈200 at 200 GHz) can be sufficient for recording the entire DNP enhancement profile (≈0.3 GHz in width) without the need for the resonator retuning. FIG. 15B shows DNP buildup when the EPR frequency is set to the optimal 197.44 GHz. The signal enhancement becomes stationary at the contact times >400 s.

Figure 16:
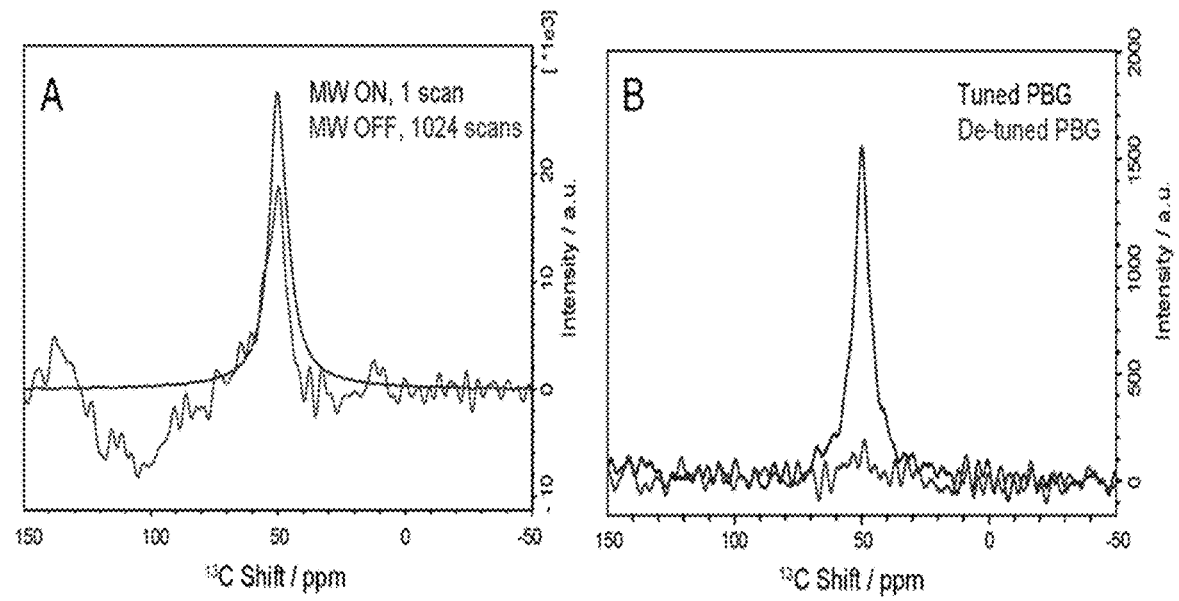

FIG. 16A can demonstrate an example of a maximum $^{13}C$ DNP enhancement of ε≈1,500 (out of the theoretical value of 2,600) that can be achieved at room temperature, 197.44 GHz mmW frequency, and the maximum available incident mmW power (ca. 150-200 mW). The value for ε can be determined from comparing the peak intensities with mmW on and off but adjusted for the number of scans. This can be compared to the previously reported enhancements for synthetic nanodiamonds and monocrystalline diamonds of up to ε≈400 although an indirect enhancement factor of 1,000 can be reported at much lower magnetic fields/frequencies (54 GHz electronic spins/81 MHz $^1H$ frequency). The latter result can be obtained by extrapolating the direct-detect NMR signal for the same physical sample, but acquired at 400 MHz. This can result since in some situations, no $^{13}C$ signal can be detected at 1.9 T magnetic field of the DNP. The result can show an example of natural-abundance, single-scan $^{13}C$ NMR signal from HPHT single crystal diamond. This can demonstrate DNP enhancement of ε≈1, 500 at 0 dB attenuation of the input W-band signal (150-200 mW incident mmW power at 197.4 GHz and 1,000 s contact time) when compared with $^{13}C$ resonance detected using direct excitation with 1024 scans and 60 s recycle delay.

FIG. 16B can show DNP effect at ca. <100 μW incident power (blue line). Even a slight detuning of the PBG resonator (red line) at the same incident power can result in a drastic decrease of the DNP effect. In the results shown, DNP is carried out at room temperature. FIG. 17B can show an example of a series of measurements carried out at very low incident mmW powers. This can be performed in order to evaluate the gain in mmW $B_{1e}$ on a sample provided by the PBG resonator. The input of the W-band power amplifier can be attenuated so that the doubler output can be <100 μW. These power levels can be close to the detection limit of an Ophir™ power meter and, therefore, the readings can be approximate. As such low power levels, the DNP-enhanced $^{13}C$ signal in the diamond crystal can be expected to be approximately proportional to the incident mmW power. Despite extremely low mmW power, an appreciable DNP effect (ε≈90 or ca. 6% of the maximum) can be observed. The resonator can be deliberately de-tuned by a slight displacement of the mirror by tens of micrometers while keeping the incident power and frequency the same. Such a detuning can result in almost an order of magnitude drop in $^{13}C$ NMR signal almost down to the noise level. This observation can confirm the formation of a resonant mode in the PBG probehead that can provide for a significantly enhanced $B_{1e}$ on the sample. The gain in average $B_{1e}$ on the sample afforded by the resonator can be further characterized by measuring intensity of the natural abundance $^{13}C$ NMR signal from the single crystal HTHP diamond as a function of the incident power. Two probehead configurations can be compared: one with the PBG resonator and the other when only an aluminum mirror is retained. The incident mmW power can be attenuated before a W-band QuinStar power amplifier as a simple technical solution.

Figure 17:
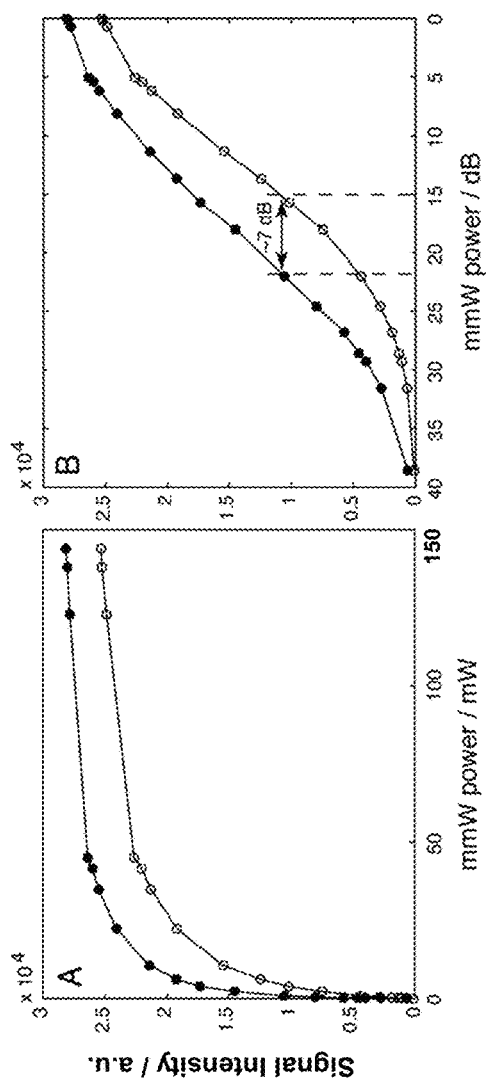

FIG. 17 shows an example of amplitude of the natural abundance $^{13}C$ NMR signal from a single crystal HTHP diamond as a function of the incident mmW power obtained using two probehead configurations: (1) a tuned PBG resonator (filled circles) and (2) a configuration with only reflective aluminum mirror retained (open circles). FIG. 17A can show an example of a rapid saturation of the DNP effect for the both probehead configurations. From the logarithmic plot of FIG. 17B, the two curves can be shifted horizontally by approximately 7 dB, which can correspond to about a five-fold gain in the average mmW power on the sample provided by the PBG resonator. The outputs of the PA and the frequency doubler can be non-linear, especially when those devices are driven close to saturation. Furthermore, the plots of the output vs. input power for the power amplifier and the doubler can depend on the mmW frequency. In addition, In some cases, a power meter might not be not calibrated by the manufacturer at frequencies below 300 GHz, and the example shown can be approximate.

An alternative approach that can be based on measurements of DNP-enhanced NMR signal as a function of time-averaged power deposited into the sample. Namely, a train of rectangular voltage pulses at 50 kHz repetition frequency can be applied on the varactor side of the W-band source using an AWG, e.g., an Agilent AWG. The levels of the varactor voltages can be chosen to either match the optimal DNP frequency of 197.44 GHz to which the resonator can be tuned, or can be placed at the frequency of ca. 200 MHz below where no detectable DNP enhancement can be observed. Both frequencies can be within the resonator bandwidth of about 1 GHz (Q≈200). Because the DNP buildup can be several orders of magnitude slower that the period of the varactor voltage train, the DNP effect can be expected to be proportional to the time-average mmW power applied at the frequency matching the DNP conditions. Average mmW power can be adjusted by varying the pulse duty cycle.

Figure 18:
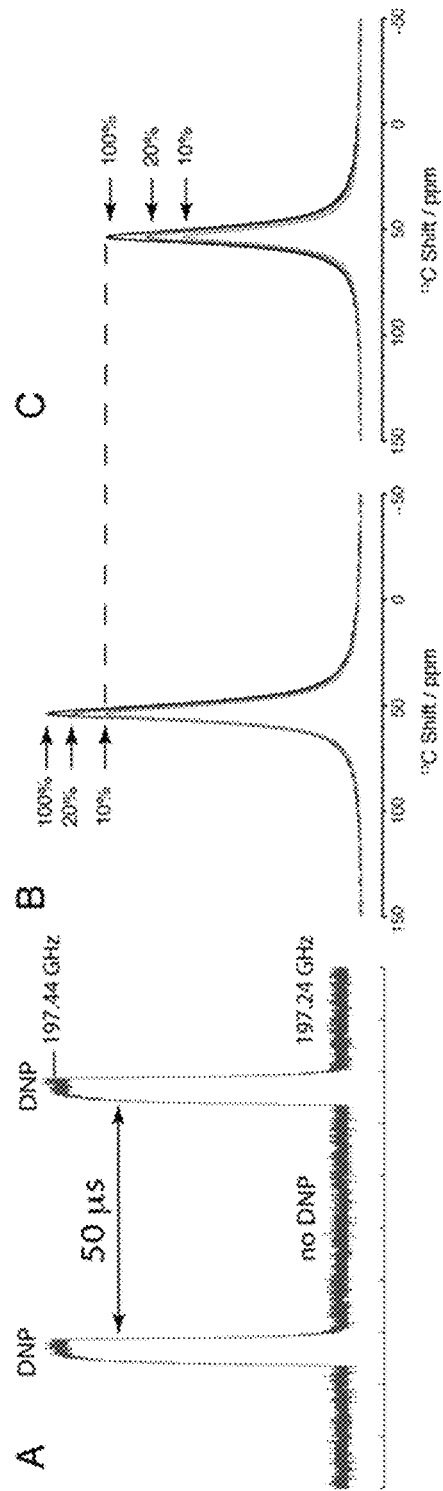

FIG. 18 can show an example of DNP effect as monitored by $^{13}C$ natural abundance signal from a diamond crystal at various fractions of the time the mmW frequency was kept at the maximum DNP effect. FIG. 18A can show frequency transients for 5 μs DNP-on pulses at 197.44 GHz and 10% duty cycle as monitored by a 200 GHz diode detector measuring power reflected from the probehead. FIG. 18B can show $^{13}C$ NMR signals at 0 dB mmW attenuation at different DNP-on duty cycles as indicated in the Figure. FIG. 13C can show $^{13}C$ NMR signals at 10 dB attenuation of the W-band signal before the power amplifier (measured at ≈15 mW power after the doubler) at various duty cycles as shown. Spectra can be plotted on the same relative amplitude scale for direct comparison. Dashed line demonstrates that 10% duty cycle at 0 dB mmW attenuation can correspond to 100% on-resonance irradiation at 10 dB attenuation.

The frequency transients can be measured by monitoring 200 GHz reflected signal using a detector diode and an oscilloscope. As illustrated by FIG. 18B, at 20% and even at 10% fraction of time at the DNP-on condition, a significant DNP enhancement can be retained. Moreover, the gated regime with only 10% duty cycle at 0 dB attenuation can correspond to substantially 100% on-resonance irradiation at 10 dB attenuation. The DNP effect can depend on the average power delivered to the sample, regardless of whether it is applied in a continuous or a gated fashion. Comparisons of the DNP enhancements at other duty cycles and attenuations can give similar results. Thus, the gated mode of the DNP operation can be used to reduce the average mmW power on the sample without an attenuator by simply controlling the DNP-on duty cycle. Such a gated mode of operation can be particularly advantageous for measuring DNP enhancement vs. incident power curves and also to control mmW power at low levels where direct measurements can be inaccurate and direct reading precision attenuators are not available.

Figure 19:
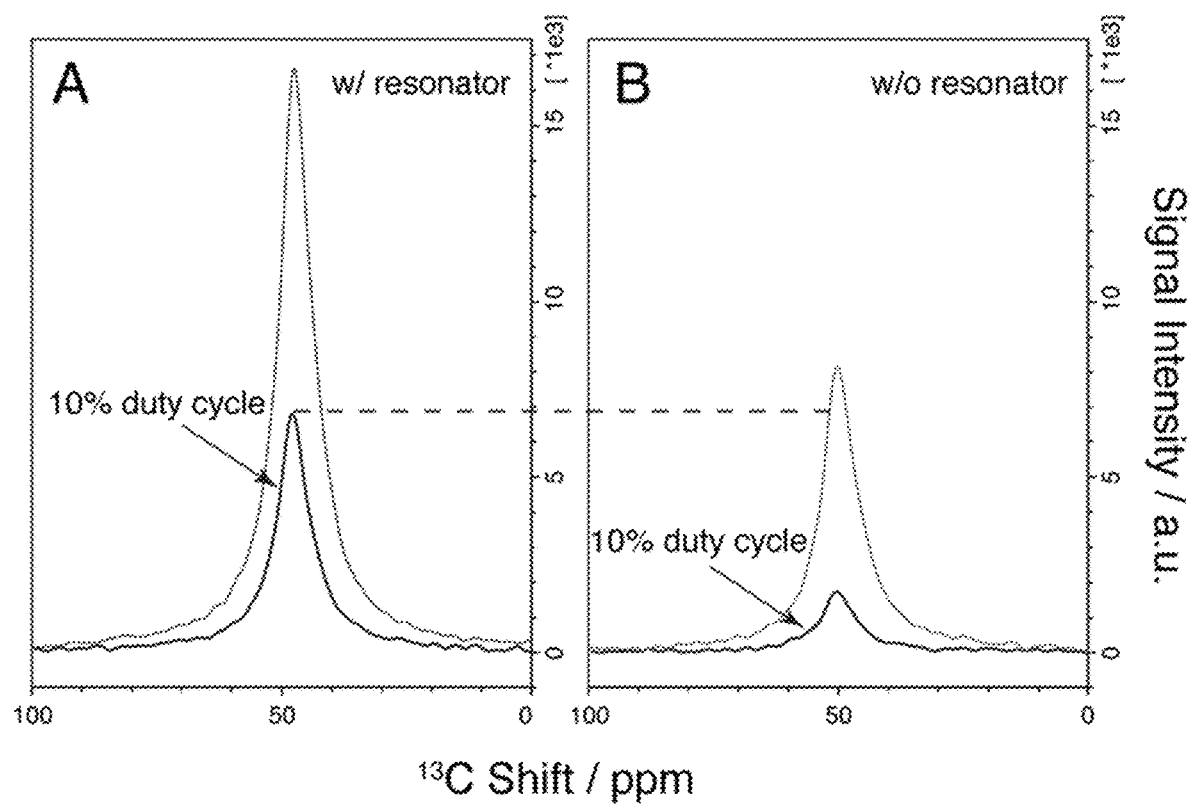

FIG. 19 shows an example comparison between single-scan natural abundance $^{13}C$ NMR signals from HPHT single crystal diamond obtained for the two probe-head configurations: one with the PBG resonator and the other with the mirror only. The incident power can be set to ca. 1.5 mW and then the average power can be further reduced by 10 dB by applying a 10% duty cycle for the DNP-on condition. As can be seen from comparing FIG. 19A and FIG. 19B, the DNP gain with PBG resonator at 10% duty cycle can be close to that at 100% duty cycle, albeit without the resonator. Thus, the gain in the average mmW power on the sample provided by the resonator can be about <8-fold as compared to the mirror-only probe-head configuration, i.e. similar to the 5-fold gain obtained by the direct power method. This can be monitored by the natural abundance $^{13}C$ NMR signal from single crystal HPHT diamond at ca. 1.5 mW incident mmW power corresponding to a partial saturation of the DNP effect. FIG. 12A can show an example of $^{13}C$ NMR signal at continuous mmW irradiation (red line) and at 10% duty cycle (on-off DNP resonance condition, black line) using the probehead assembled with the PBG resonator. FIG. 12A can be similar to FIG. 19A, but with the aluminum mirror only. Approximately <8-fold gain in average power can be observed by comparing the DNP effects at 10% duty cycle (10 db less of average incident mmW power) with the resonator (A) relative to 100% duty cycle without the resonator (B). As already noted above, geometry and dimensions of the diamond crystal in the examples can be suboptimal for achieving the maximum average $|B_{1e}|_{eff}^2$ enhancement over the entire sample volume with the PBG resonator vs. the mirror-only configuration. Indeed, while the tangent of the dielectric losses for synthetic diamonds at mmW frequencies can be exceptionally low ($\tan(\delta)<5\cdot 10^{-5}$), the dielectric constant is $\varepsilon' \approx 5.67$[50], resulting in $\frac{1}{4}\lambda \approx 0.157$ mm. Since the thickness of the diamond crystal can be almost twice as much (0.3 mm), it is very likely that some higher order modes are excited in the PBG structure. Furthermore, the rectangular shape of the crystal in the examples does not match the circular diameter of the 1D photonic crystal, thus, resulting in a further perturbation of the resonator mode.

Accordingly, room-temperature DNP of natural-abundance $^{13}C$ spins in a single-crystal HPHT diamond can be demonstrated at ca. 300 MHz/200 GHz frequencies using all solid-state mm-wave power components capable of generating 0.2-0.5 W of incident power from ca. 180 to 199 GHz. A one-dimensional photonic band gap (PBG) 200 GHz resonator can be integrated within a doubly-tuned NMR rf coil. Considerable (up to $\varepsilon \approx 1,500$) DNP enhancements can be demonstrated with the incident mmW power of 200 mW and even at power levels as low as <100 μW ($\varepsilon \approx 90$). PBG resonator design can provide up to ~8 fold boost in average mmW power at the sample as compared to a non-resonant structure employing an aluminum mirror as a mmW reflector. Multi-resonant DNP probehead design can also incorporate microliter-scale sample volumes can be demonstrated through the examples discussed herein regarding the diamond crystal.

Additional aspects can replace the aluminum mirror with a low-loss photonic band gap structure, which can reduce mmW losses inside the resonator. Optimizing the shape of the sample itself can also be beneficial for reducing PBG resonator mode distortions. A large variety of different possible types of 1D photonic crystals can provide additional flexibility for improving the probehead conversion factors in terms of $|B_{1e}|_{eff}^2$ over the sample volume. For instance, configurations with multiple defects or when the sample with specified and matching dielectric properties is a part of the photonic crystal periodic structure itself can provide further aspects. Additional aspects of the probehead can include employing ceramic wafers having greater differences in their respective dielectric constants and lower tangent losses, as well as optimizing the tapered transition and mmW focusing into the NMR coil.

As used herein, the terms "approximate" and "approximately" can refer to values that differ about 30% more or less, about 25% more or less, about 20% more or less, about 15% more or less, about 10% more or less, or about 5% more or less than the approximate value noted.

Although embodiments have been described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present invention defined in the following claims, the scope of which are to be accorded the broadest interpretation so as to encompass modifications and equivalent structures.

Aspects of the present disclosure can be described using the following clauses:

Clause 1 involves a resonator, comprising: a periodic 1D structure comprising a plurality of dielectric layers, where individual layers of the plurality of dielectric layers each have a respective thickness that is one-quarter of a respective wavelength of a target magnetic resonance frequency within that individual layer or a multiple thereof; a first layer of the plurality of dielectric layers having a first dielectric constant; a second layer of the plurality of dielectric layers that is adjacent to the first layer, the second layer having a second dielectric constant, wherein the first dielectric constant and the second dielectric constant are different; a defect comprising a sample for testing, a defect thickness being up to one-half of a wavelength of the target magnetic resonance frequency within the defect; and an electromagnetic coil that generates an electromagnetic field.

Clause 2 involves the resonator of clause 1, further comprising a reflective surface.

Clause 3 involves the resonator of any one of clauses 1 or 2, wherein the defect is adjacent to the reflective surface.

Clause 4 involves the resonator of any one of clauses 1 to 3, further comprising a movable plunger, wherein the reflective surface is attached to the movable plunger, the defect is attached to the reflective surface, and an adjustment of the movable plunger tunes the resonator.

Clause 5 involves the resonator of any one of clauses 1 to 4, wherein the sample comprises a liquid confined between at least two layers of the defect.

Clause 6 involves the resonator of any one of clauses 1 to 5, wherein the defect comprises a porous material that is impregnated with the sample for testing.

Clause 7 involves the resonator of any one of clauses 1 to 6, wherein the periodic 1D structure is formed within a cylinder having reflective surfaces.

Clause 8 involves a resonator, comprising: A resonator, comprising: a periodic 1D structure comprising a plurality of layers, where individual layers of the plurality of layers each have a respective thickness that is one-quarter of a respective wavelength of a target magnetic resonance frequency within that individual layer or a multiple thereof; a first layer of the plurality of layers having a first dielectric constant; a second layer of the plurality of layers that is adjacent to the first layer, the second layer having a second dielectric constant, wherein the first dielectric constant and the second dielectric constant are different; and a defect comprising a sample, a defect thickness being up to one-half of a wavelength of the target magnetic resonance frequency within the defect.

Clause 9 involves the resonator of clause 8, further comprising a reflective surface, wherein the reflective surface is curved.

Clause 10 involves the resonator of any one of clauses 8 to 9, wherein the defect is adjacent to the reflective surface.

Clause 11 involves the resonator of any one of clauses 8 to 10, wherein the sample comprises a liquid confined between at least two layers of the defect.

Clause 12 involves the resonator of any one of clauses 8 to 11, wherein the defect comprises a porous material, and the sample is held within the porous material.

Clause 13 involves the resonator of any one of clauses 8 to 12, wherein the periodic 1D structure is formed within a cylinder having reflective surfaces.

Clause 14 involves an apparatus, comprising: a 1D periodic structure comprising a plurality of layers, where individual layers of the plurality of layers each have a thickness that is one-quarter of a respective wavelength of a target magnetic resonance frequency within that individual layer or a multiple thereof; a first layer of the plurality of layers having a first dielectric constant; a second layer of the plurality of layers that is adjacent to the first layer, the second layer having a second dielectric constant, wherein the first dielectric constant and the second dielectric constant are different; and a defect comprising a sample, a defect thickness being up to one-half of a wavelength of the target magnetic resonance frequency within the defect.

Clause 15 involves the apparatus of clause 14, further comprising a reflective surface.

Clause 16 involves the apparatus of any one of clauses 14 to 15, wherein the defect comprises a liquid confined between at least two layers of the defect.

Clause 17 involves the apparatus of any one of clauses 14 to 16, wherein the defect comprises a porous material that is impregnated with the sample for testing.

Clause 18 involves the apparatus of any one of clauses 14 to 17, wherein the target magnetic resonance frequency is 2 GHz or greater.

Clause 19 involves the apparatus of any one of clauses 14 to 18, wherein incident power at the target magnetic resonance frequency is 100 mW or less.

Clause 20 involves the apparatus of any one of clauses 14 to 19, wherein the 1D periodic structure is formed within a cylinder having reflective surfaces.

Therefore, the following is claimed:

1. A resonator, comprising:
a periodic 1D structure comprising a plurality of dielectric layers, where individual layers of the plurality of dielectric layers each have a respective thickness that is one-quarter of a respective wavelength of a target magnetic resonance frequency within that individual layer or a multiple thereof;
a first layer of the plurality of dielectric layers having a first dielectric constant;
a second layer of the plurality of dielectric layers that is adjacent to the first layer, the second layer having a second dielectric constant, wherein the first dielectric constant and the second dielectric constant are different;
a defect comprising a sample for testing, a defect thickness being up to multiples of one-half of a wavelength of the target magnetic resonance frequency within the defect; and
an electromagnetic coil that generates an electromagnetic field.

2. The resonator of claim 1, further comprising a reflective surface.

3. The resonator of claim 2, wherein the defect is adjacent to the reflective surface.

4. The resonator of claim 2, further comprising a movable plunger, wherein the reflective surface is attached to the movable plunger, the defect is attached to the reflective surface, and an adjustment of the movable plunger tunes the resonator.

5. The resonator of claim 1, wherein the sample comprises a liquid confined between at least two layers of the defect.

6. The resonator of claim 1, wherein the defect comprises a porous material that is impregnated with the sample for testing.

7. The resonator of claim 1, wherein the periodic 1D structure is formed within a cylinder having reflective surfaces.

8. A resonator, comprising:
a periodic 1D structure comprising a plurality of layers, where individual layers of the plurality of layers each have a respective thickness that is one-quarter of a respective wavelength of a target magnetic resonance frequency within that individual layer or a multiple thereof;
a first layer of the plurality of layers having a first dielectric constant;
a second layer of the plurality of layers that is adjacent to the first layer, the second layer having a second dielectric constant, wherein the first dielectric constant and the second dielectric constant are different; and
a defect comprising a sample, a defect thickness being up to a multiple of one-half of a wavelength of the target magnetic resonance frequency within the defect.

9. The resonator of claim 8, further comprising a reflective surface, wherein the reflective surface is curved.

10. The resonator of claim 9, wherein the defect is adjacent to the reflective surface.

11. The resonator of claim 8, wherein the sample comprises a liquid confined between at least two layers of the defect.

12. The resonator of claim 8, wherein the defect comprises a porous material, and the sample is held within the porous material.

13. The resonator of claim 8, wherein the periodic 1D structure is formed within a cylinder having reflective surfaces.

14. An apparatus, comprising:
a 1D periodic structure comprising a plurality of layers, where individual layers of the plurality of layers each have a thickness that is one-quarter of a respective wavelength of a target magnetic resonance frequency within that individual layer or a multiple thereof;
a first layer of the plurality of layers having a first dielectric constant;
a second layer of the plurality of layers that is adjacent to the first layer, the second layer having a second dielectric constant, wherein the first dielectric constant and the second dielectric constant are different; and
a defect comprising a sample, a defect thickness being up to a multiple of one-half of a wavelength of the target magnetic resonance frequency within the defect.

15. The apparatus of claim 14, further comprising a reflective surface.

16. The apparatus of claim 14, wherein the defect comprises a liquid confined between at least two layers of the defect.

17. The apparatus of claim 14, wherein the defect comprises a porous material that is impregnated with the sample for testing.

18. The apparatus of claim 14, wherein the target magnetic resonance frequency is 2 GHz or greater.

19. The apparatus of claim 14, wherein incident power at the target magnetic resonance frequency is 100 mW or less.

20. The apparatus of claim 14, wherein the 1D periodic structure is formed within a cylinder having reflective surfaces.

* * * * *